US009953709B2

(12) United States Patent
Shirakawa et al.

(10) Patent No.: US 9,953,709 B2
(45) Date of Patent: Apr. 24, 2018

(54) SEMICONDUCTOR MEMORY DEVICE AND MEMORY SYSTEM

(71) Applicant: TOSHIBA MEMORY CORPORATION, Minato-ku (JP)

(72) Inventors: Masanobu Shirakawa, Chigasaki (JP); Marie Takada, Yokohama (JP); Yuji Nagai, Sagamihara (JP)

(73) Assignee: TOSHIBA MEMORY CORPORATION, Mintato-ku (JP)

( * ) Notice: Subject to any disclaimer, the term of this patent is extended or adjusted under 35 U.S.C. 154(b) by 0 days.

(21) Appl. No.: 15/383,165

(22) Filed: Dec. 19, 2016

(65) Prior Publication Data

US 2018/0068729 A1 Mar. 8, 2018

Related U.S. Application Data

(60) Provisional application No. 62/383,902, filed on Sep. 6, 2016.

(51) Int. Cl.

*G11C 11/34* (2006.01)
*G11C 16/04* (2006.01)
*G11C 16/12* (2006.01)
*G11C 16/26* (2006.01)
*G06F 11/10* (2006.01)
*G11C 29/52* (2006.01)
*G06F 3/06* (2006.01)

(52) U.S. Cl.

CPC .............. *G11C 16/12* (2013.01); *G06F 3/064* (2013.01); *G06F 3/0619* (2013.01); *G06F 3/0653* (2013.01); *G06F 3/0679* (2013.01); *G06F 11/1068* (2013.01); *G11C 16/26* (2013.01); *G11C 29/52* (2013.01)

(58) Field of Classification Search

CPC ......... G11C 16/12; G11C 16/26; G11C 29/52; G06F 11/1068; G06F 3/0619; G06F 3/064; G06F 3/0653; G06F 3/0679

See application file for complete search history.

(56) References Cited

U.S. PATENT DOCUMENTS 7,808,819 B2 10/2010 Murin et al.
8,189,401 B2 5/2012 Fukuda
9,548,127 B1 * 1/2017 Takada .................. G11C 16/26
2009/0231914 A1 9/2009 Yu et al.
2010/0238724 A1 9/2010 Fukuda
(Continued)

FOREIGN PATENT DOCUMENTS

JP 2006-318621 11/2006
JP 2010-218637 9/2010
(Continued)

*Primary Examiner* — Toan Le

(74) *Attorney, Agent, or Firm* — Oblon, McClelland, Maier & Neustadt, L.L.P.

(57) ABSTRACT

According to one embodiment, a semiconductor memory device includes a cell transistor coupled to a word line, a sense amplifier configured to output data based on a state of the cell transistor in response to a first signal asserted; and a controller configured to apply a voltage of a magnitude continuously rising to the word line, and periodically assert the first signal after a lapse of any selected one of a first time and a second time from the start of rise of the magnitude of the voltage. The first time is different from the second time.

20 Claims, 33 Drawing Sheets

(56) References Cited

U.S. PATENT DOCUMENTS

| | | | | |
|---|---|---|---|---|
| 2012/0257453 | A1* | 10/2012 | Shiino | G11C 16/26 365/185.18 |
| 2013/0148435 | A1 | 6/2013 | Matsunaga | |
| 2013/0148436 | A1 | 6/2013 | Kurosawa | |
| 2014/0219028 | A1 | 8/2014 | Alhussien et al. | |
| 2014/0281770 | A1 | 9/2014 | Kim et al. | |
| 2016/0217867 | A1 | 7/2016 | Shen et al. | |
| 2016/0267981 | A1* | 9/2016 | Hioka | G11C 16/0483 |
| 2016/0267990 | A1* | 9/2016 | Bushnaq | G11C 16/10 |
| 2017/0097869 | A1* | 4/2017 | Sharon | G06F 11/1072 |
| 2017/0140814 | A1* | 5/2017 | Puthenthermadam | G11C 16/10 |

FOREIGN PATENT DOCUMENTS

| | | |
|---|---|---|
| JP | 2011-514618 | 5/2011 |
| JP | 2013-122793 | 6/2013 |
| JP | 2013-122804 | 6/2013 |
| JP | 2014-149906 | 8/2014 |
| JP | 2014-182864 | 9/2014 |
| JP | 2015-532760 | 11/2015 |

* cited by examiner

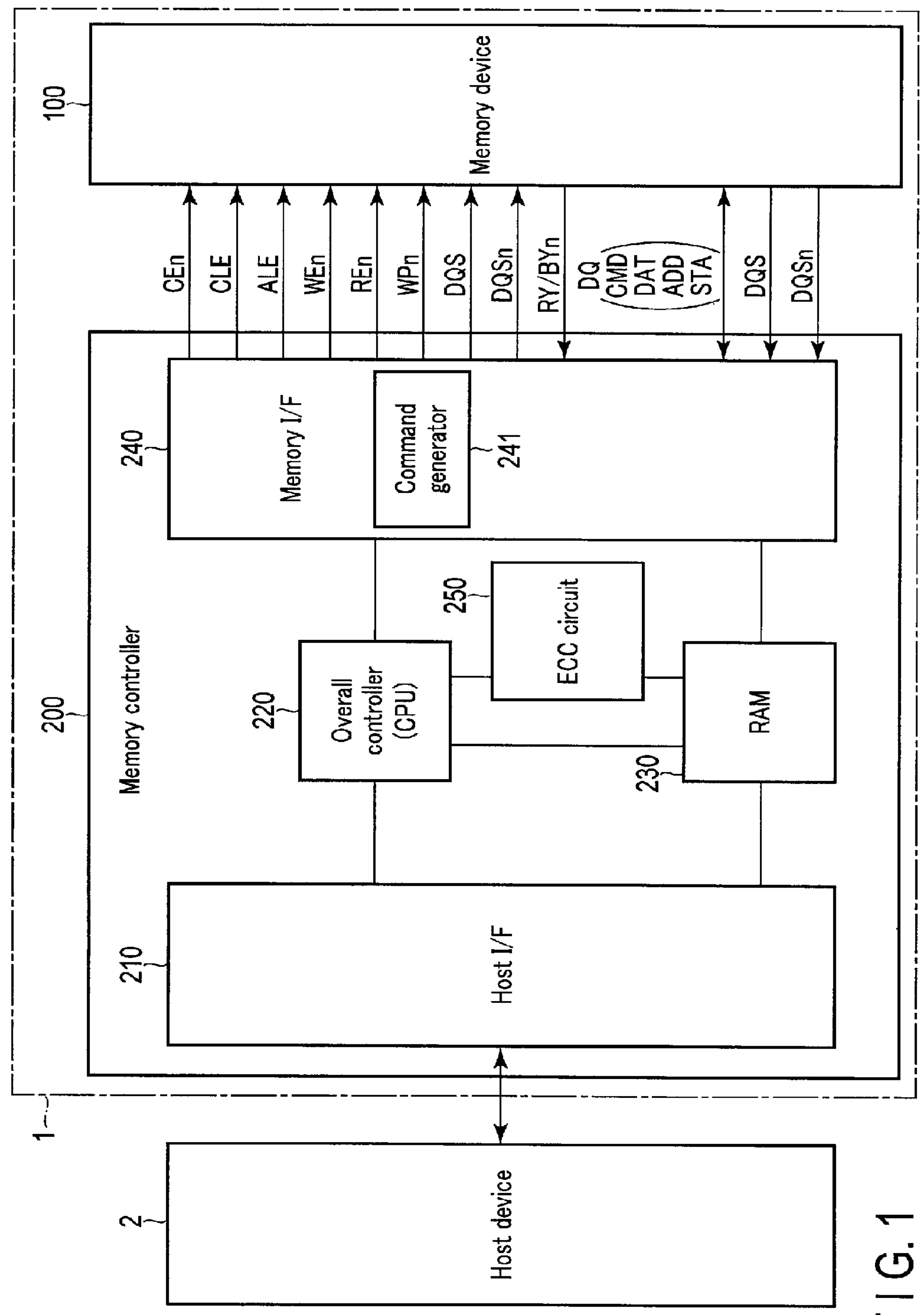
F I G. 1

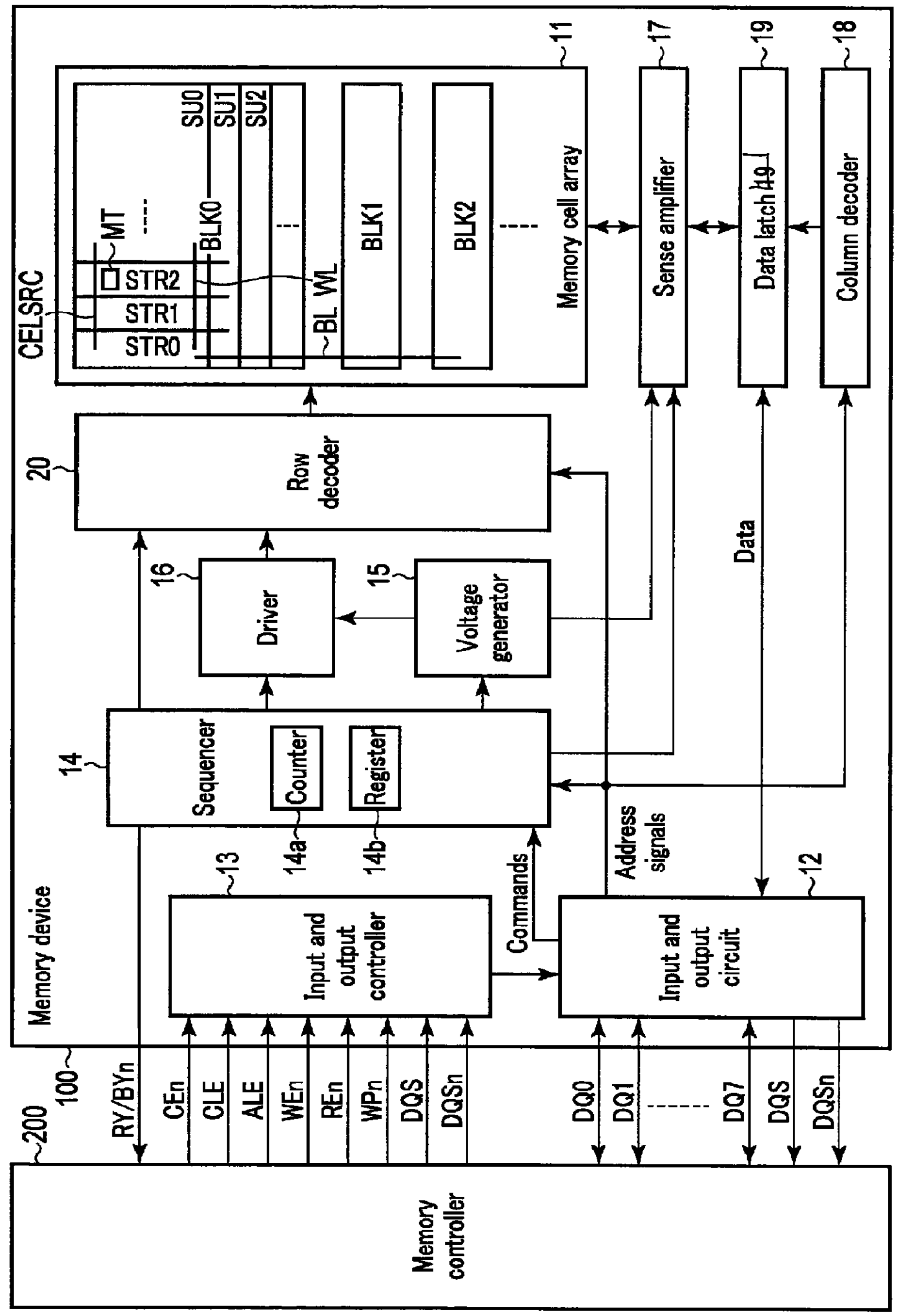
F I G. 2

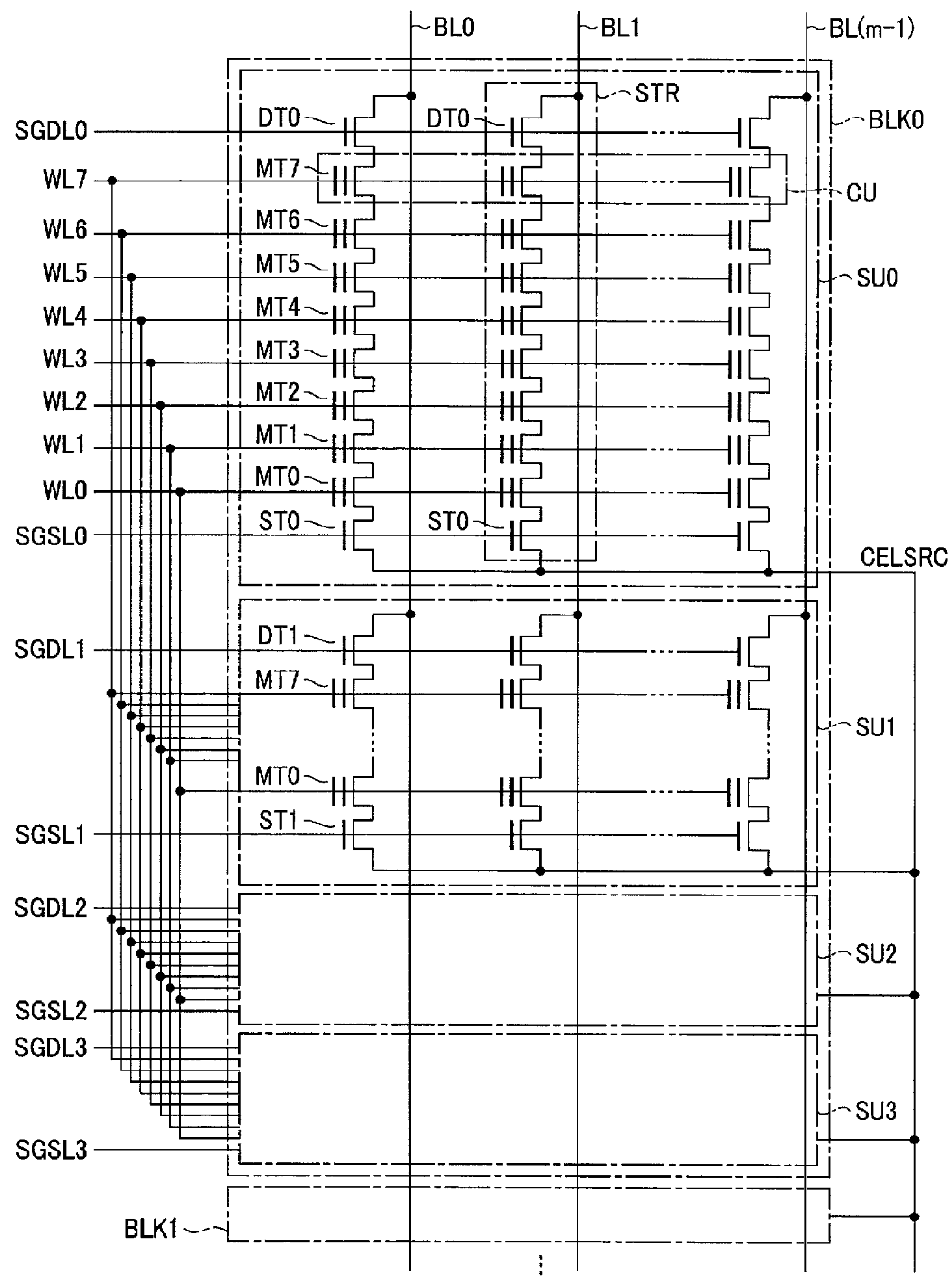
F I G. 3

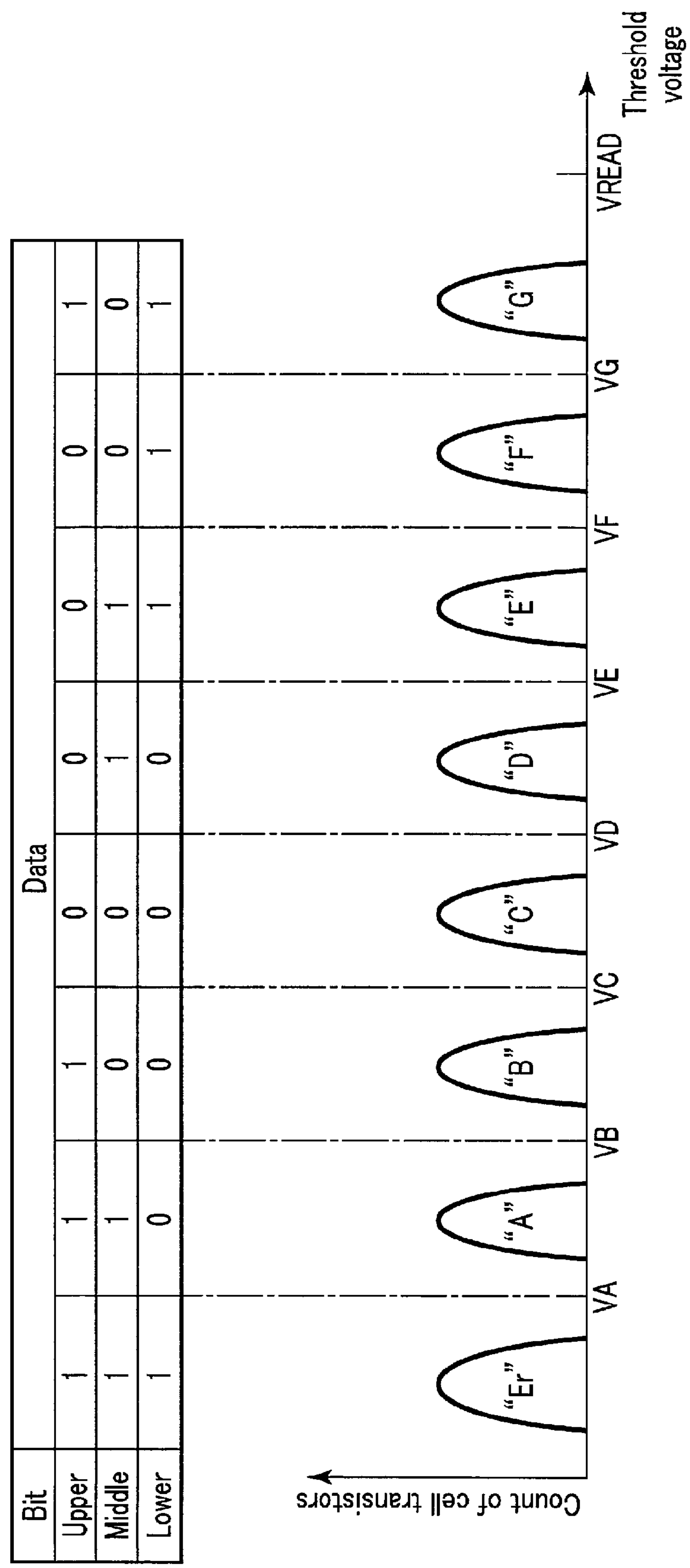
F I G. 4

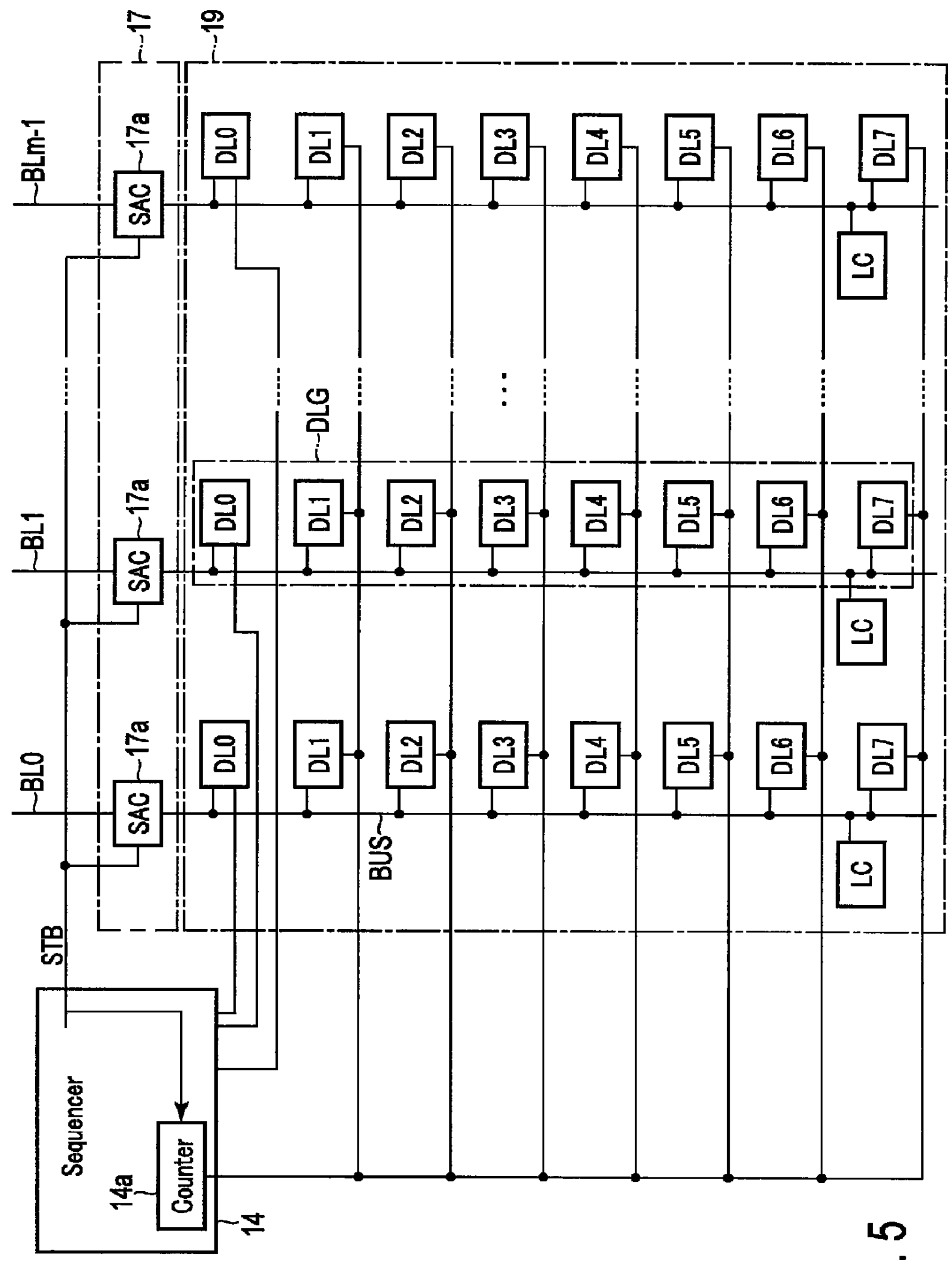
F I G. 5

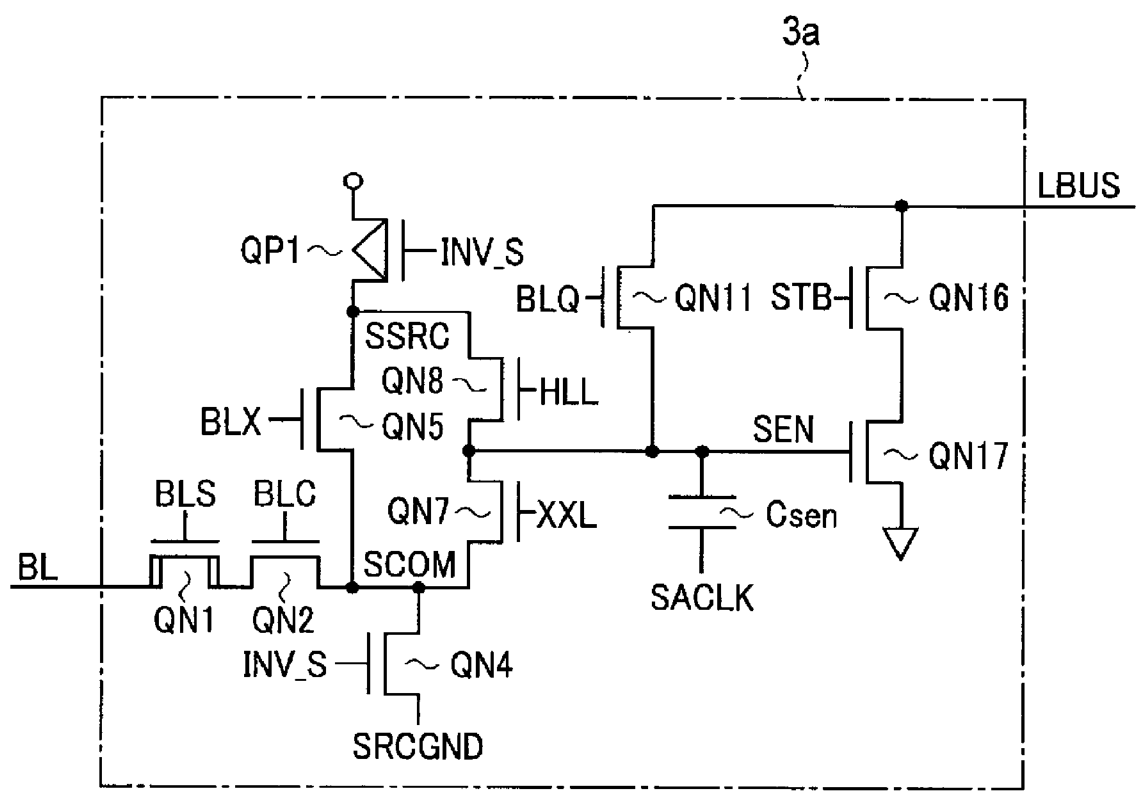
F I G. 6

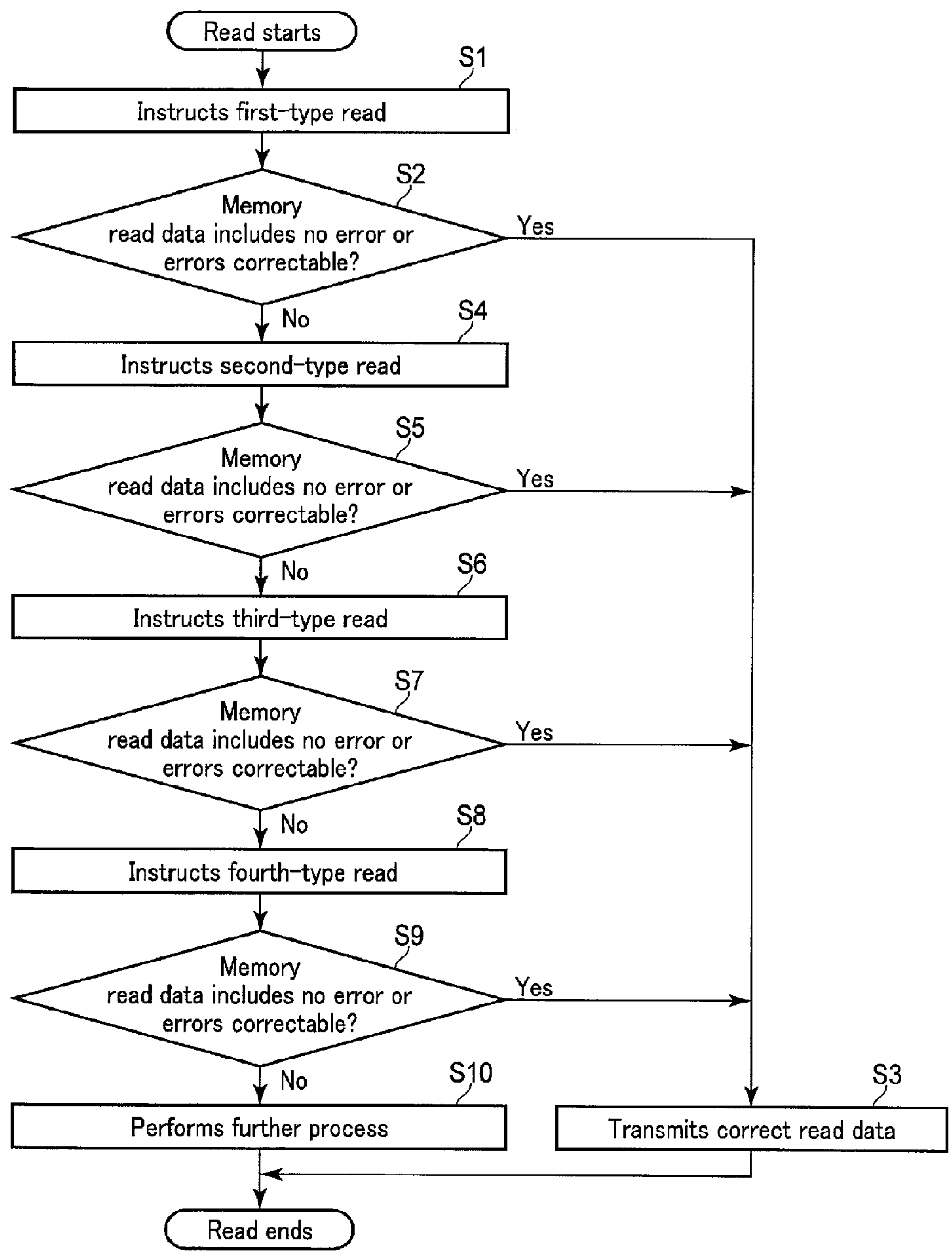
F I G. 7

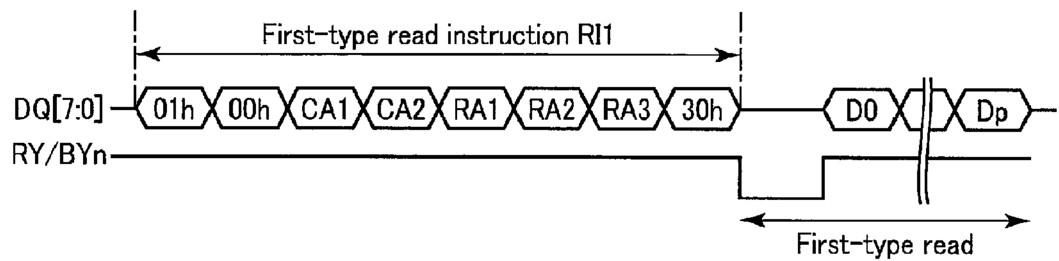
F I G. 8
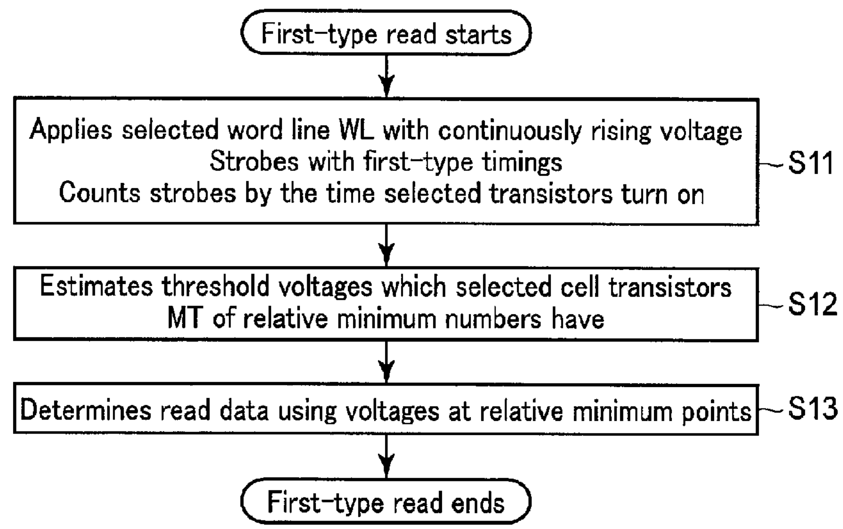
F I G. 9

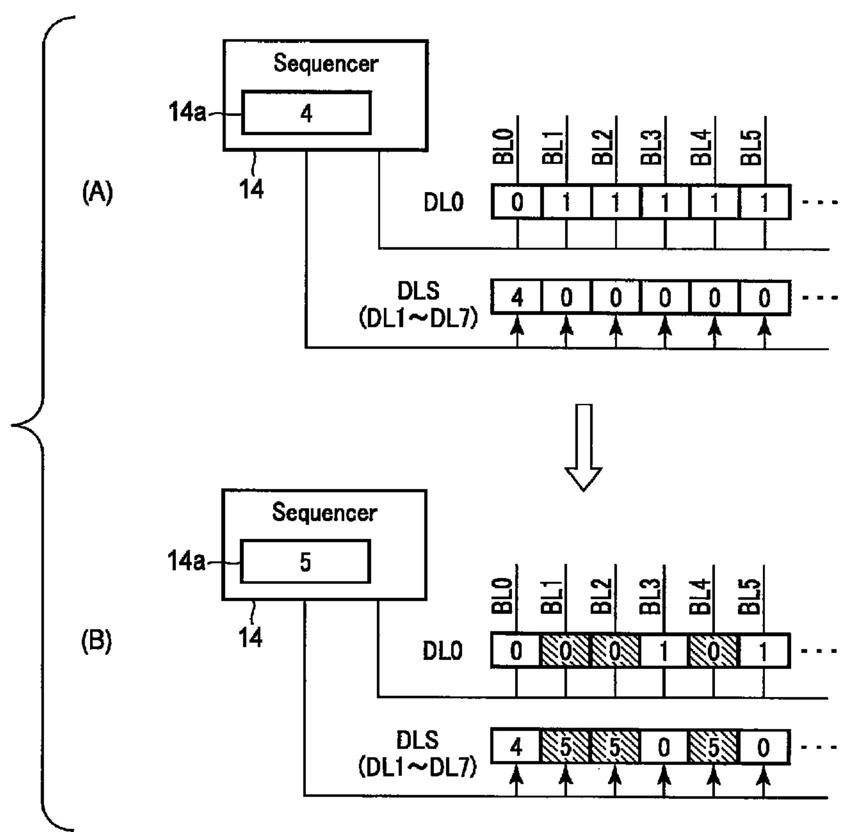
F I G. 11

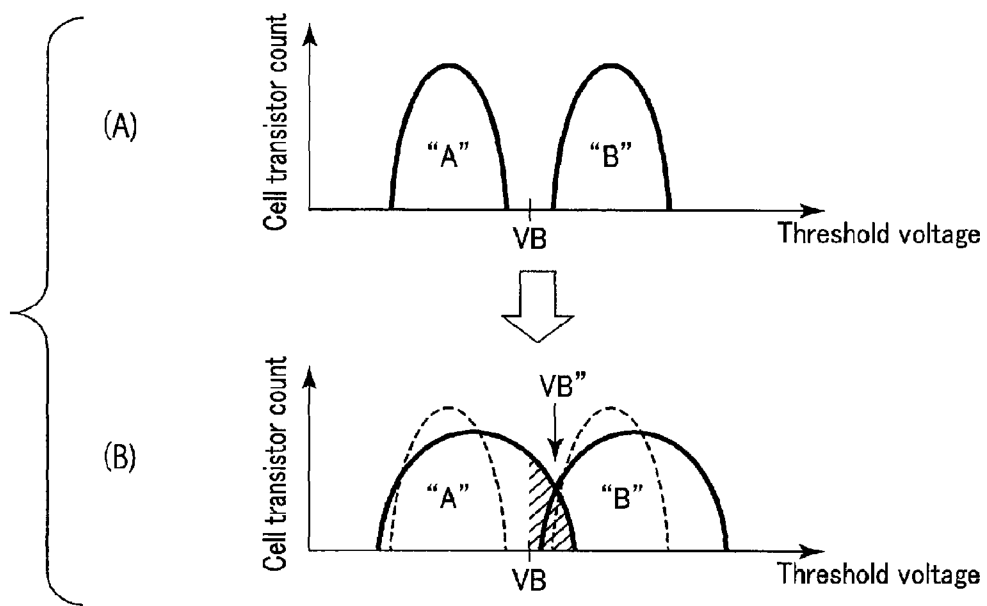
F I G. 13
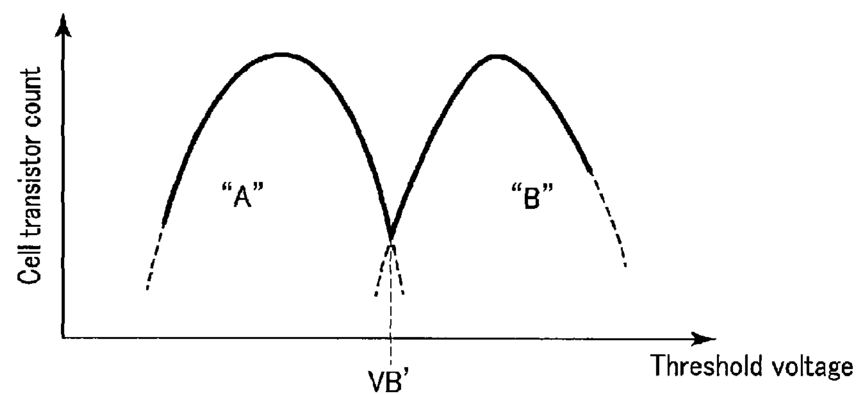
F I G. 14

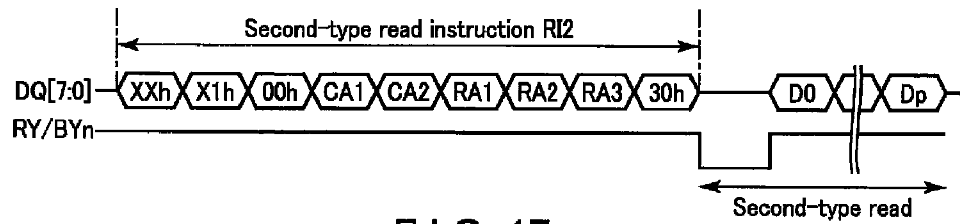
F I G. 17
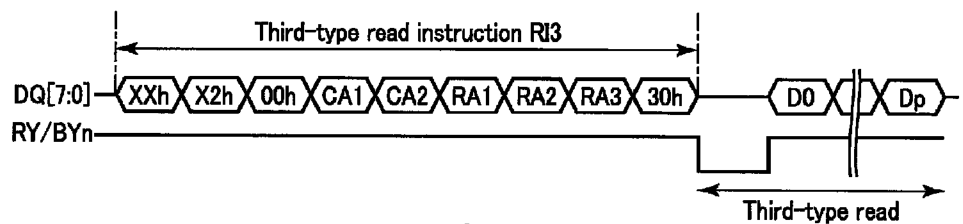
F I G. 18
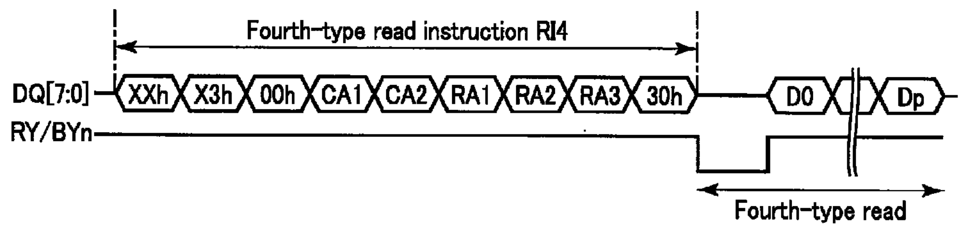
F I G. 19

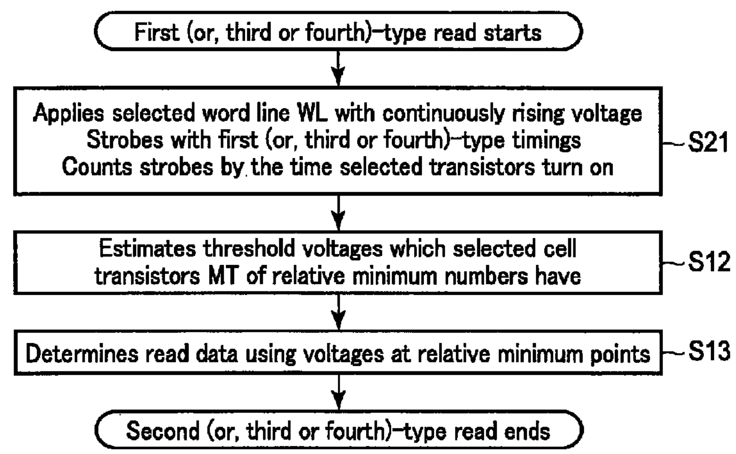
F I G. 20

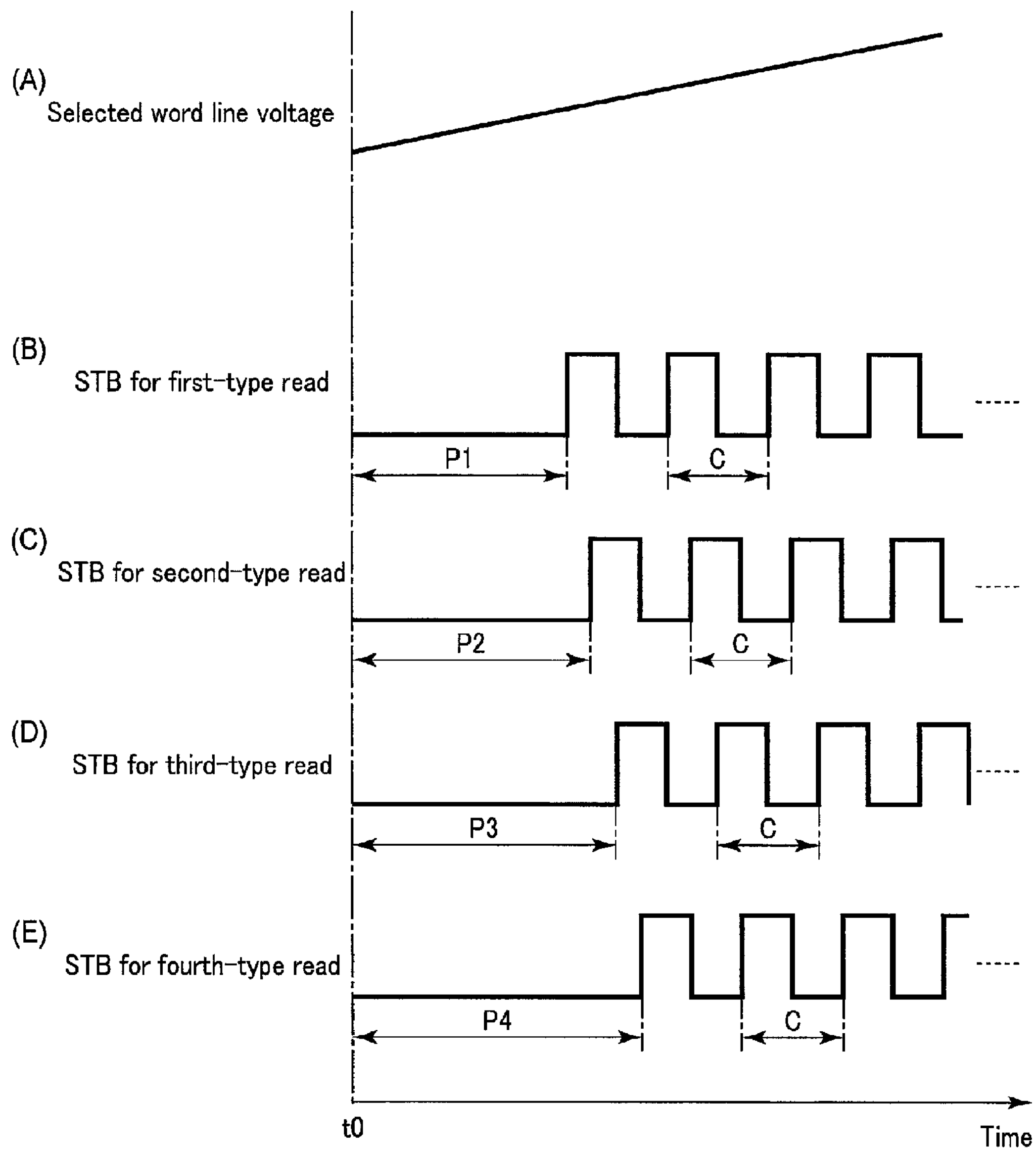
F I G. 21

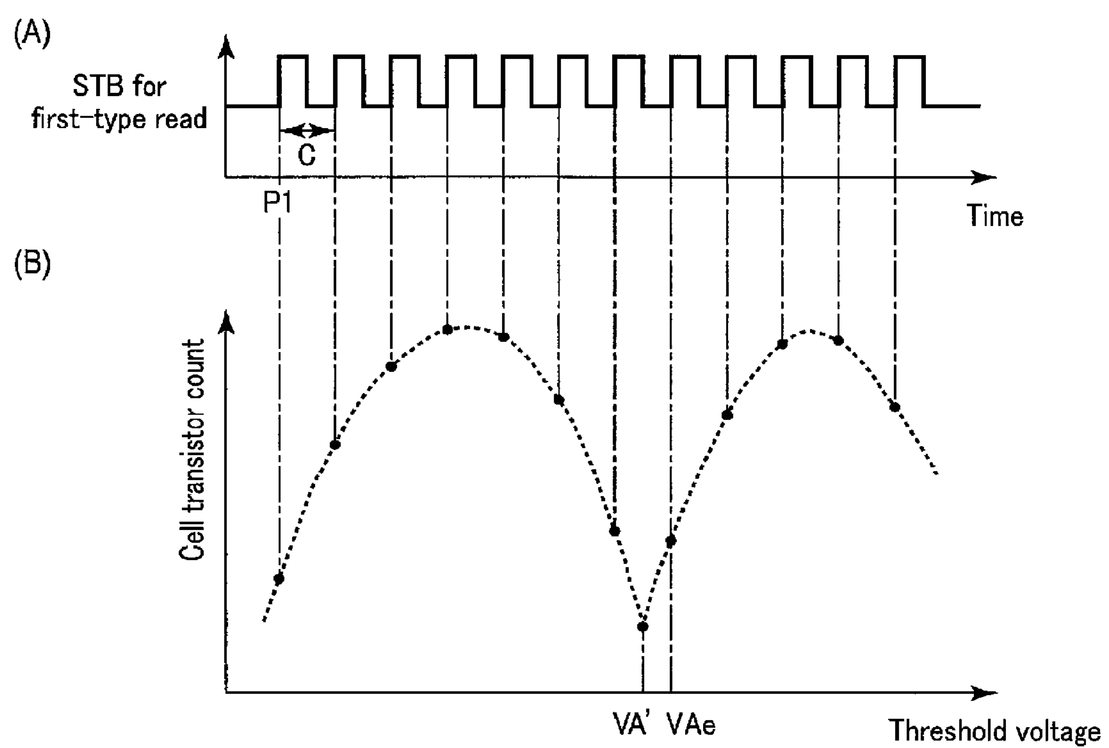
F I G. 22

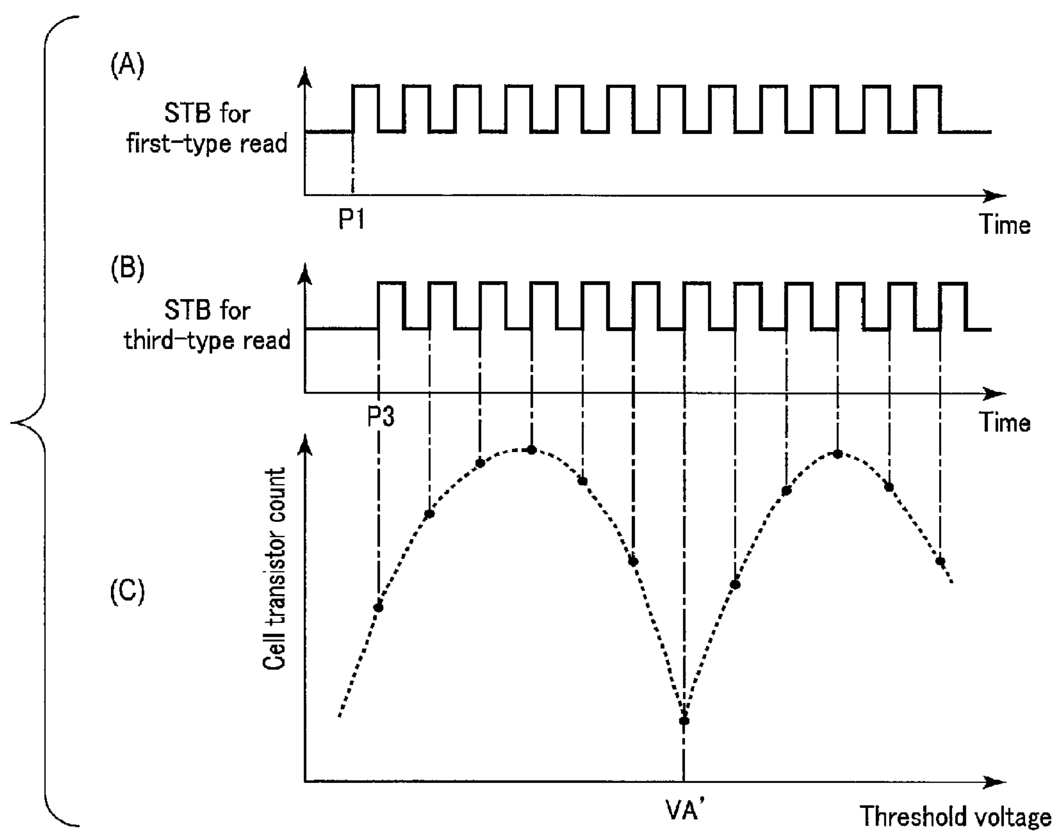
F I G. 23

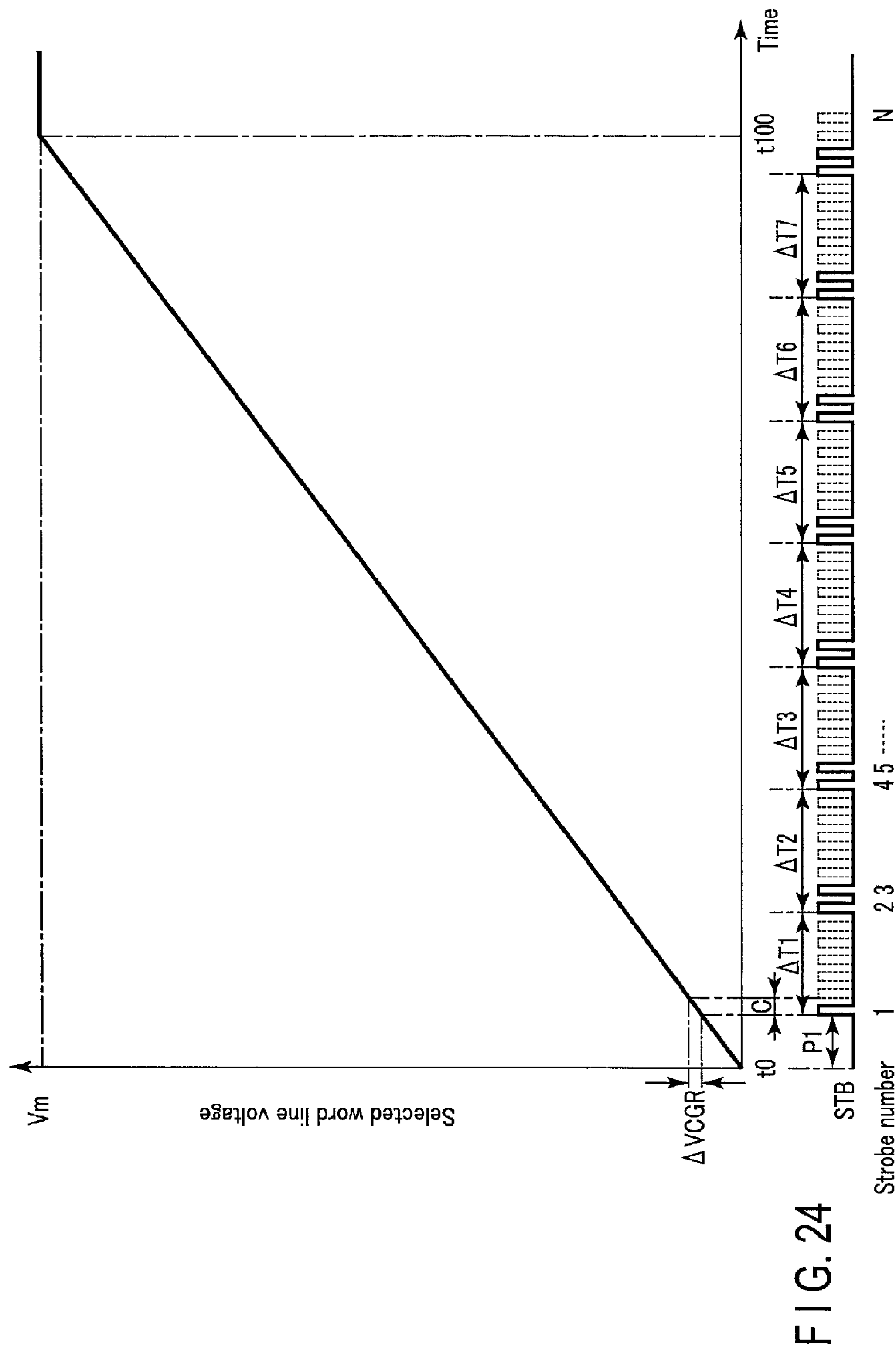
F I G. 24

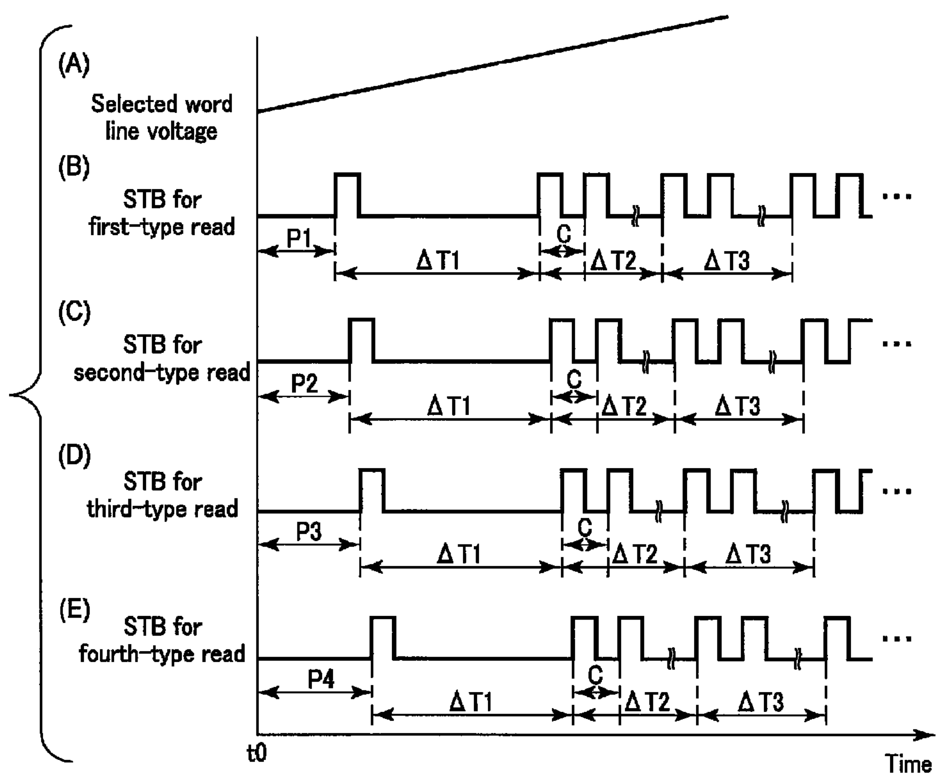
F I G. 25

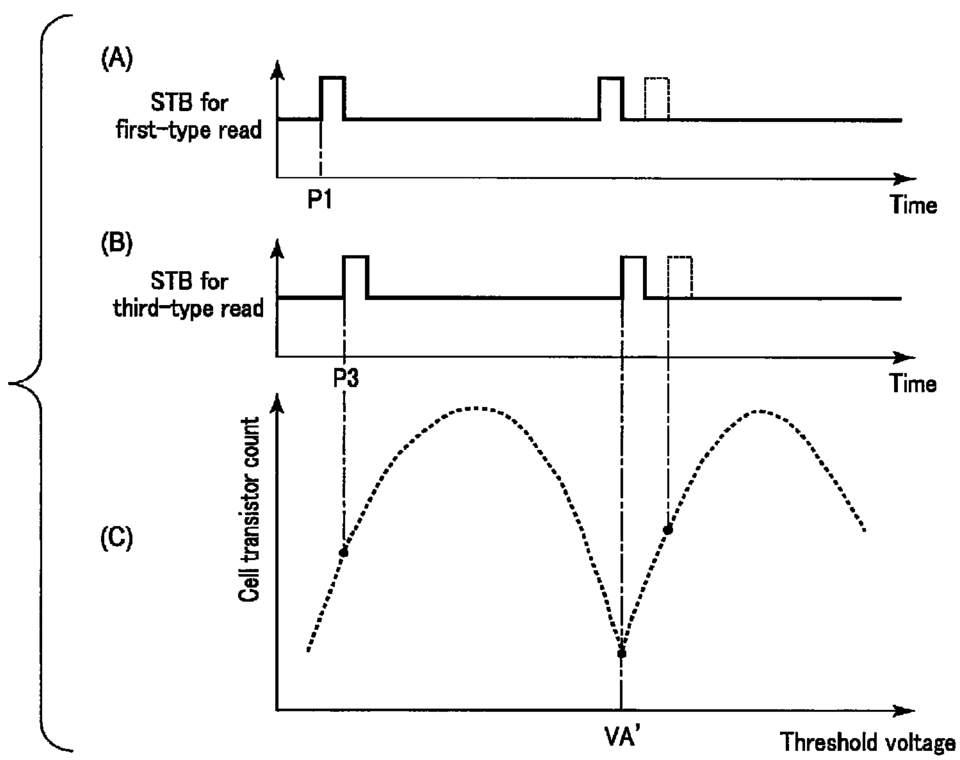
F I G. 26

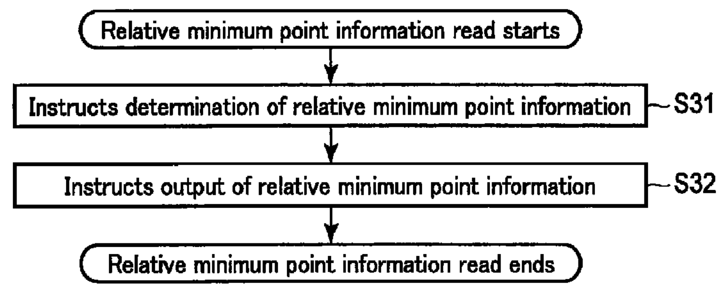
F I G. 27
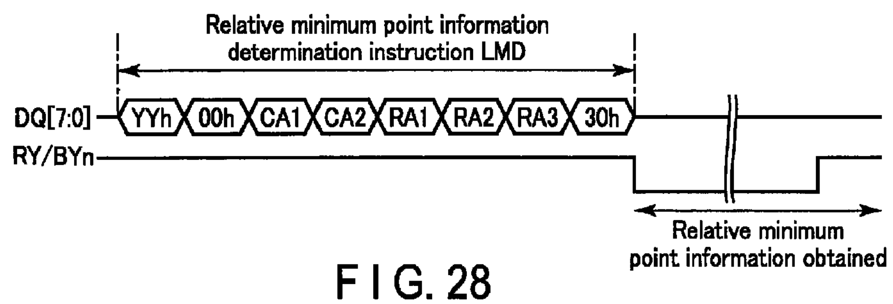
F I G. 28

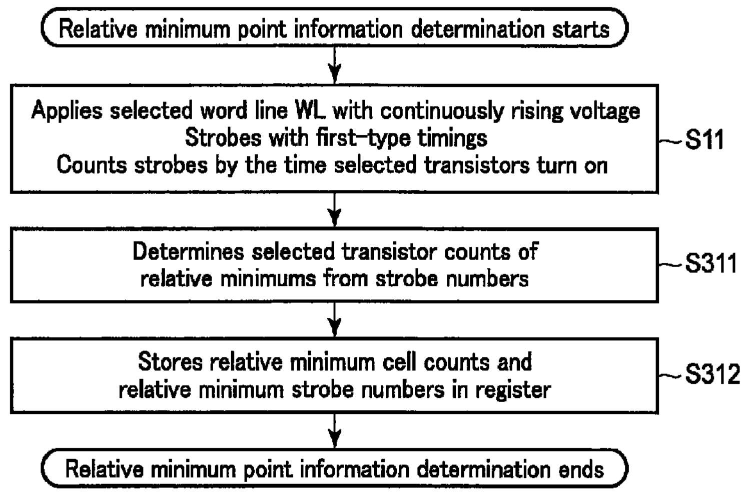
F I G. 29

| Relative minimum point | 1 | 2 | 3 | 4 | 5 | 6 | 7 |
|---|---|---|---|---|---|---|---|
| Relative minimum cell count | N1 | N2 | N3 | N4 | N5 | N6 | N7 |
| Relative minimum strobe number | I1 | I2 | I3 | I4 | I5 | I6 | I7 |
F I G. 30
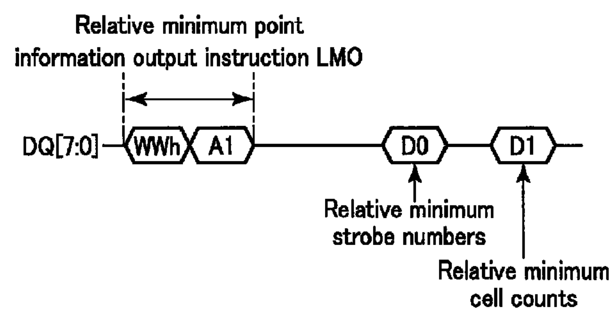
F I G. 31

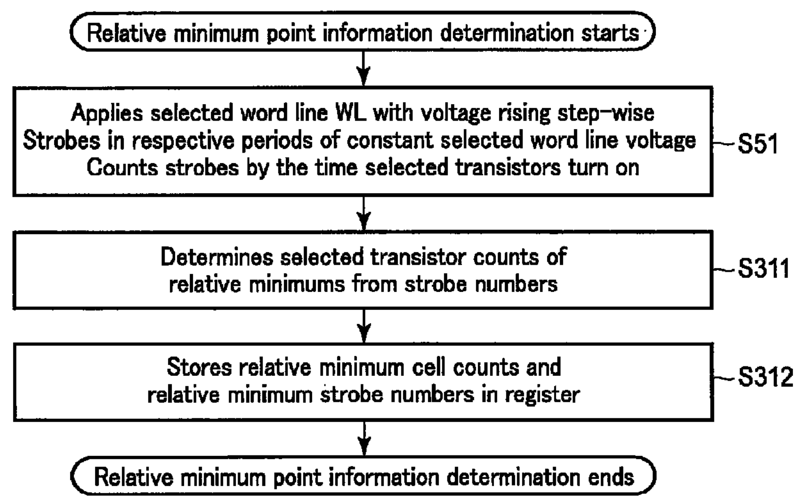
F I G. 33

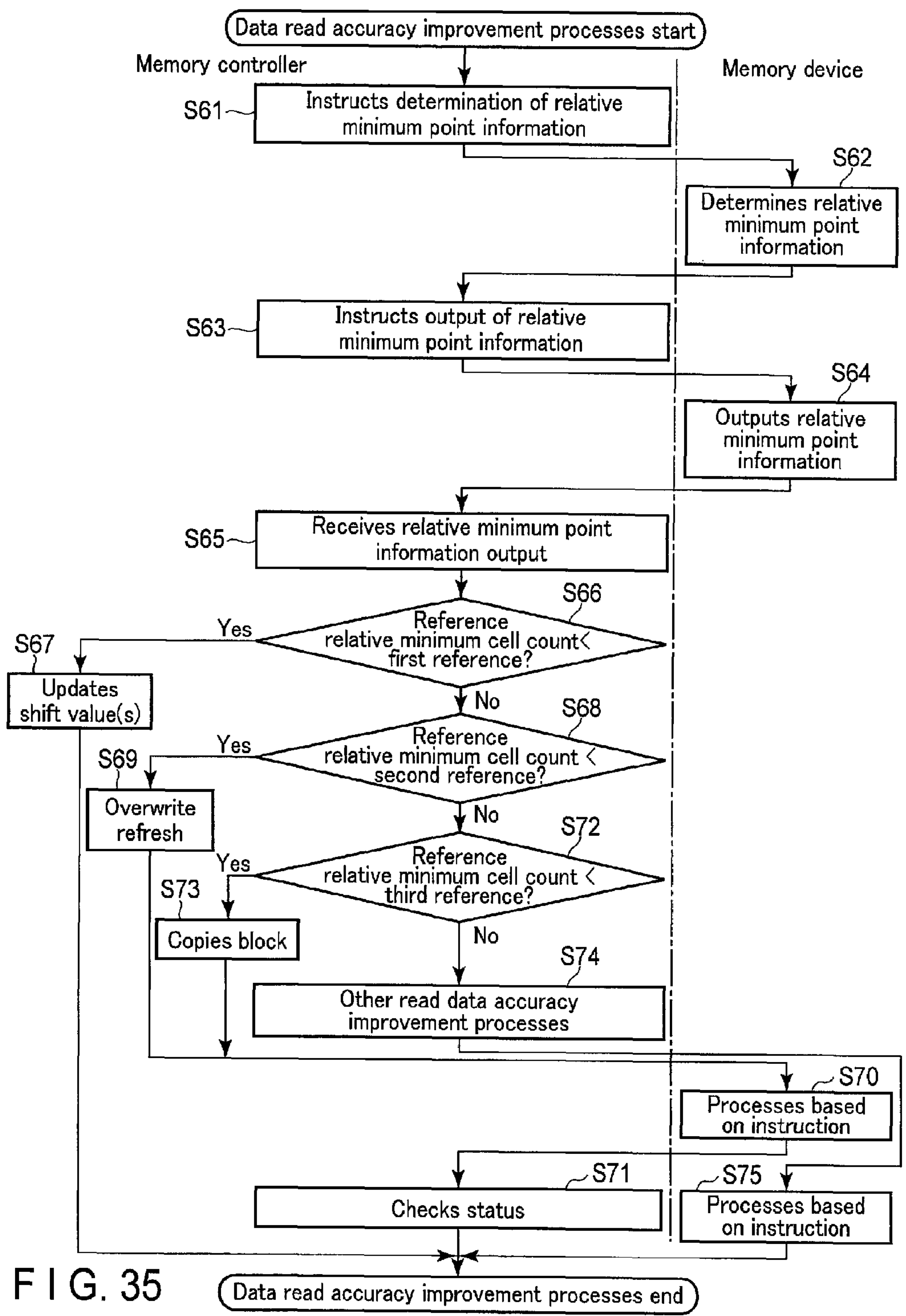
F I G. 35

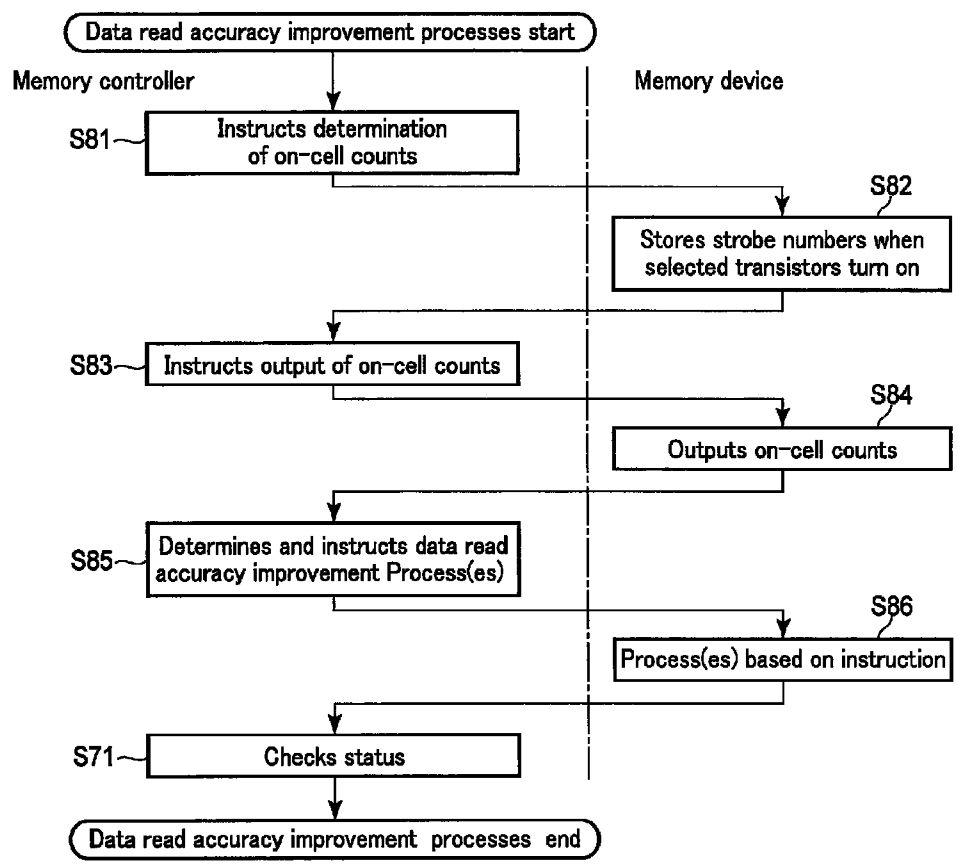
F I G. 37

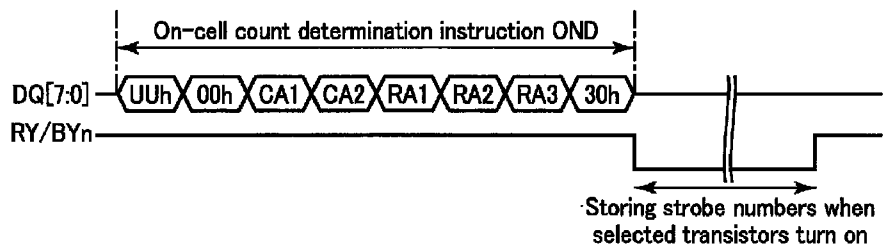
F I G. 38
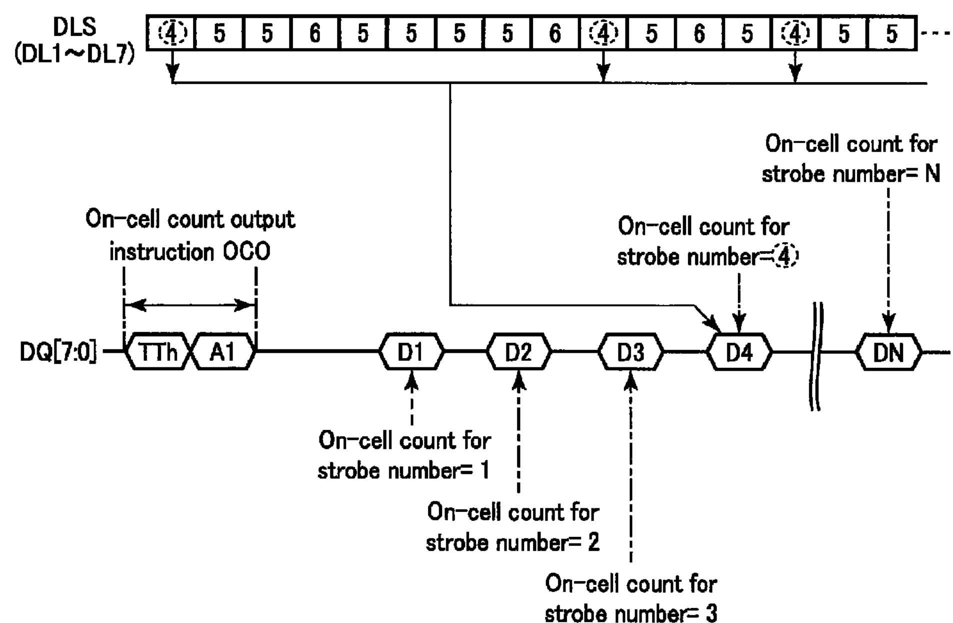
F I G. 39

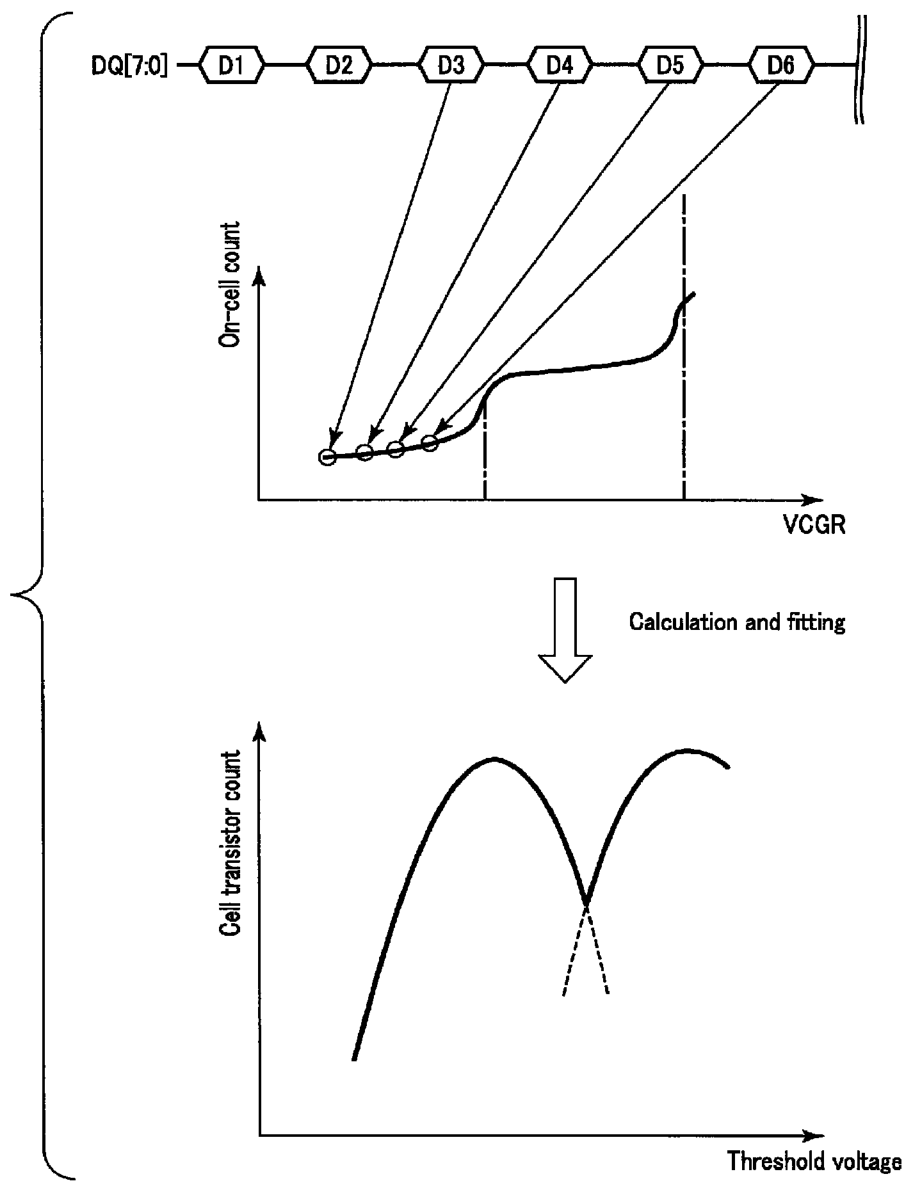
F I G. 40

SEMICONDUCTOR MEMORY DEVICE AND MEMORY SYSTEM

CROSS-REFERENCE TO RELATED APPLICATIONS

This application claims the benefit of U.S. Provisional Application No. 62/383,902, filed Sep. 6, 2016, the entire contents of which are incorporated herein by reference.

FIELD

Embodiments described herein relate generally to a semiconductor memory device and a memory system.

BACKGROUND

Semiconductor memory devices capable of storing data of two or more bits in one memory cell are known.

BRIEF DESCRIPTION OF THE DRAWINGS

FIG. 1 illustrates functional blocks of a memory system of a first embodiment;

FIG. 2 illustrates functional blocks of a semiconductor memory device of the first embodiment;

FIG. 3 illustrates an example of components and connections of a part of a cell array of the first embodiment;

FIG. 4 illustrates an example of a structure of the cell array of the first embodiment;

FIG. 5 illustrates an example of relationships between data stored in cell transistors and threshold voltages of the cell transistors of the memory device of the first embodiment;

FIG. 6 illustrates an example of components and connections of a sense amplifier circuit of the memory device of the first embodiment;

FIG. 7 illustrates an example of the flow of a read of data in the memory system of the first embodiment;

FIG. 8 illustrates an example of a signal DQ for transmitting a first-type read instruction of the first embodiment;

FIG. 9 illustrates the flow of a first-type read of the memory device of the first embodiment;

FIG. 11 illustrates an example of an operation of a sequencer and states of latch circuits during the first-type read of the memory device of the first embodiment;

FIG. 13 illustrates transition of threshold voltage distributions over time;

FIG. 14 illustrates an outline of estimating relative minimums of a threshold voltage distribution curve;

FIG. 17 illustrates an example of the signal DQ for transmitting a second-type read instruction of the first embodiment;

FIG. 18 illustrates an example of the signal DQ for transmitting a third-type read instruction of the first embodiment;

FIG. 19 illustrates an example of the signal DQ for transmitting a fourth-type read instruction of the first embodiment;

FIG. 20 illustrates the flows of the second to fourth-type reads of the memory device of the first embodiment;

FIG. 21 illustrates waveforms of a signal STB in the first to fourth-type reads of the memory device of the first embodiment over time;

FIG. 22 illustrates an example of threshold voltages and cell transistor counts based on a result of the first-type read of the memory device of the first embodiment;

FIG. 23 illustrates an example of threshold voltages and cell transistor counts based on a result of the third-type read of the memory device of the first embodiment;

FIG. 24 illustrates a voltage applied to a selected word line during the first-type read of a memory device of a modified first embodiment over time;

FIG. 25 illustrates waveforms of the signal STB in the first to fourth-type reads of the memory device of the modified first embodiment over time;

FIG. 26 illustrates an example of threshold voltages and cell transistor counts based on a result of the third-type read of the memory device of the modified first embodiment;

FIG. 27 illustrates the flow of read of relative minimum point information in a memory system of a second embodiment;

FIG. 28 illustrates an example of the signal DQ for instructing relative minimum point information determination in a memory device of the second embodiment;

FIG. 29 illustrates an example of the flow of the relative minimum point information determination in the memory device of the second embodiment;

FIG. 30 illustrates an example of details of the relative minimum point information of the memory device of the second embodiment;

FIG. 31 illustrates an example of the signal DQ for transmitting a relative minimum point information instruction and an example of the signal DQ for transmitting relative minimum point information of the second embodiment;

FIG. 33 illustrates the flow of relative minimum point information determination of the modified second embodiment;

FIG. 35 illustrates the flow of a process for improving accuracy of a read of data in a memory device by a memory controller of a third embodiment;

FIG. 37 illustrates the flow of a process for improving accuracy of a read of data in a memory device by a memory controller of a fourth embodiment;

FIG. 38 illustrates an example of the signal DQ for instructing on-cell count determination by the memory device of the fourth embodiment;

FIG. 39 illustrates an example of the signal DQ which flows to the memory device from the memory controller for transmitting an on-cell count output instruction of the fourth embodiment, and on-cell count outputs; and FIG. 40 illustrates an example of estimating a threshold voltage distribution curve by the memory controller of the fourth embodiment.

DETAILED DESCRIPTION

Figure 10:
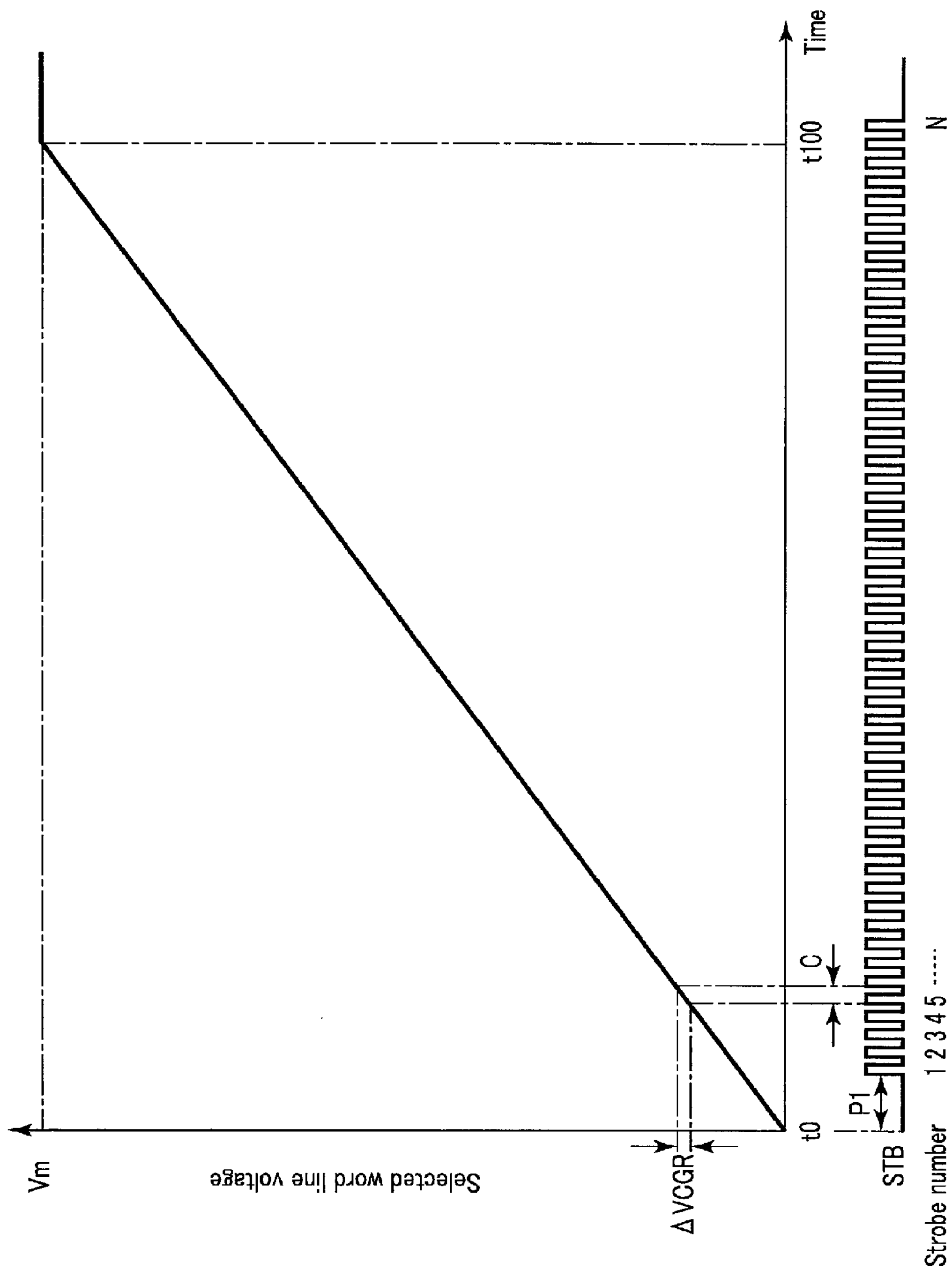
FIG. 10 illustrates a voltage applied to a selected word line during the first-type read of the memory device of the first embodiment over time.

In general, according to one embodiment, a semiconductor memory device includes a cell transistor coupled to a word line, a sense amplifier configured to output data based on a state of the cell transistor in response to a first signal asserted; and a controller configured to apply a voltage of a magnitude continuously rising to the word line, and periodically assert the first signal after a lapse of any selected one of a first time and a second time from the start of rise of the magnitude of the voltage. The first time is different from the second time.

Embodiments will now be described with reference to the figures. In the following description, components with substantially the same functionalities and configurations will be referred to with the same reference numerals, and repeated descriptions may be omitted. All descriptions for a particular embodiment are also applicable as descriptions for another embodiment unless stated otherwise.

Each functional block can be implemented as hardware, computer software, or combination of the both. For this reason, in order to clearly illustrate that each block can be any of hardware, software or combination, descriptions will be made in terms of their functionalities in general. It is not necessary that functional blocks are distinguished as in the following examples. For example, some of the functions may be implemented by functional blocks different from those illustrated below. Furthermore, an illustrated functional block may be divided into functional sub-blocks.

Any step in a flow of a method of an embodiment is not limited to any illustrated order, and can occur in an order different from an illustrated order and/or can occur concurrently with another step. In the specification and claims, to "be coupled" includes direct coupling and coupling via any conductive component.

First Embodiment

<1.1. Configuration (Structure)>

FIG. 1 illustrates functional blocks of a memory system 1 of the first embodiment. As illustrated in FIG. 1, a memory system 1 communicates with a host device 2, and stores data from the host device 2 and reads data to the host device 2 based on instructions of the host device 2. The memory systems 1 may be a memory card such as a SD™ card, and a solid state device (SSD).

The memory system 1 includes a semiconductor memory device 100 and a memory controller 200. The memory device 100 and the memory controller 200 may be on separate chips, or on one chip. The memory controller 200 receives commands from the host device 2, and controls the memory device 100 based on the received commands. Specifically, the memory controller 200 writes data instructed to be written by the host device 2 (host write data) into the memory device 100, and reads data instructed to be read by the host device 2 (host read data) from the memory device 100 and transmits the read data to the host device 2. The memory device 100 is a nonvolatile semiconductor memory device, and, for example, is a NAND flash memory.

The memory controller 200 includes a host interface 210, an overall controller 220, a random access memory (RAM) 230, a memory interface 240, and an ECC circuit 250. The memory controller 200 includes as hardware, for example, a processor such as a central processing unit (CPU), a read only memory (ROM), and an RAM, and performs a part or all of functions of the host interface 210, the overall controller 220, the memory interface 240, and ECC circuit when firmware (program) stored in the ROM is executed by the processor. Furthermore, a part or all of functions of the overall controller 220, the memory interface 240, and the ECC circuit 250 may be implemented by hardware.

The host interface 210 is coupled to the host device 2 via a bus, and manages communications between the memory controller 200 and the host device 2. The overall controller 220 is implemented by a part of functions of the processor and the RAM, for example. The overall controller 220 manages overall control of the memory controller 200, controls the memory interface 240, and controls cooperation of the RAM 230 and the memory interface 240.

The RAM 230 temporarily stores data, which includes data to be written in the memory device 100 (memory write data), data read from the memory device 100 (memory read data), and data which indicates the states of the memory device 100 and is referred to by the overall controller 220 for controlling the memory device 100. The memory interface 240 follows the control of the overall controller 220 to control the memory device 100 and learn the state of the memory device 100. The memory interface 240 is implemented by a part of functions of the processor and the RAM, for example.

The memory interface 240 includes a command generator 241. The command generator 241 follows the control of the overall controller 220 to generate various commands CMD for implementing requests from the overall controller 220.

The ECC circuit 250 translates host write data into error correction codes (ECCs). The error correction codes can be generated by any known method. In general, an error correction code includes host write data and data for error correction. The data for error correction includes parity data, for example. The obtained error correction code is memory write data, and is written in the memory device 100. The ECC circuit 250 also performs calculation to memory read data in an attempt to obtain right (error-corrected) host read data included in that memory read data. Right host read data can be obtained when the errors are fewer than the correction capacity, which is determined based on the technique for generating error correction codes adopted by the ECC circuit 250. When the memory read data include errors more than the correction capacity adopted by the ECC circuit 250, the ECC circuit 250 notifies the overall controller 220 that right host read data could not be obtained.

The ECC circuit 250 can also generate product codes. Generation of a product code includes, from the string of bits each from plural separate memory write data items (sets of host write data and parity), generating another parity, for example. The product codes are also written in the memory device 100 as independent memory write data.

The memory interface 240 is coupled to the memory device 100 via a bus. The bus is a NAND bus when based on an example of the memory device 100 being a NAND flash memory, and the following description and figures are based on the example of the NAND bus. The NAND bus transmits signals CEn, CLE, ALE, WEn, REn, WPn, RY/BYn, DQ, DQS, and DQSn. Herein, "n" at the end of the name of a signal indicates the inverted logic of the signal having the name without "n" at the end, and indicates that the signal is asserted when it is low.

An asserted signal CEn enables the memory device 100. The asserted signal CLE notifies the memory device 100 that the signal DQ flowing to the memory device 100 in parallel to the asserted signal CLE is a command. An asserted signal ALE asserted notifies the memory device 100 that the signal DQ flowing to the memory device 100 in parallel to the asserted signal ALE is an address. An asserted signal WEn instructs the memory device 100 to take in the signal DQ flowing to the memory device 100 in parallel to the asserted signal WEn. An asserted signal REn instructs the memory device 100 to output the signal DQ. An asserted signal WPn prohibits the memory device 100 from writing or erasing data. The signal RY/BYn indicates whether the memory device 100 is in a ready state or a busy state, and indicates the busy state with the low level. The memory device 100 accepts commands from the memory controller 2 in the ready state, and does not accept commands from the memory controller 2 in the busy state.

The signal DQ (signals DQ0 to DQ7) has a width of, for example, eight bits, is substantial data, and includes commands (CMD), memory write data or memory read data (DAT), address signals (ADD), status data (STA), etc. The memory read data may be simply referred to as read data. The signals DQS and DQSn flowing to the memory device 100 from the memory controller 200 instruct timings for outputting the signal DQ to the memory device 100. In contrast, the signal DQS and DQSn flowing to the memory controller 200 from the memory device 100 notify timings for outputting the signal DQ to the memory controller 200.

FIG. 2 illustrates functional blocks of the memory device 100 of the first embodiment. As illustrated in FIG. 2, the memory device 100 includes components, such as a memory cell array 11, an input and output circuit 12, an input and output controller 13, a sequencer (controller) 14, a voltage generator 15, a driver 16, a sense amplifier 17, a column decoder 18, a data latch 19, and a row decoder 20.

The cell array 11 includes plural memory blocks BLK (BLK0, BLK1, . . . ). A block BLK is a unit for data erasure, for example, and data in each block BLK is erased together. Data may be erased in a unit smaller than one block BLK, such as a half of a block BLK.

Each block BLK is a set of plural string units SU (SU0, SU1, . . . ). Each string unit SU is a set of plural NAND strings STR (STR0, STR1, . . . ). A string STR includes plural memory cell transistors (cell transistors) MT. The cell array 11 is further provided with interconnects, such as word lines WL, bit lines BL, a cell source line CELSRC, select gate lines SGDL and SGSL.

The input and output circuit 12 receives and transmits the signal DQ. The input and output circuit 12 also transmits the data strobe signals DQS and DQSn.

The input and output controller 13 receives various control signals from the memory controller 200, and controls the input and output circuit 12 based on the control signals. The control signals include the signals CEn, CLE, ALE, WEn, REn, and WPn, and the data strobe signals DQS and DQSn.

The sequencer 14 receives the commands and address signals from the input and output circuit 12, and controls the voltage generator 15, the driver 16, the sense amplifier 17, and the column decoder 18 based on the commands and address signals. The sequencer 14 includes a counter 14*a* and a register 14*b*.

The voltage generator 15 receives a power potential from outside the memory device 100, and generates various potentials (voltages) from the power potential. The generated potentials are supplied to components, such as the driver 16 and sense amplifier 17. The potentials generated by the voltage generator 15 include potentials applied to the word lines WL, the select gate lines SGDL and SGSL, and the source line CELSRC, for example. Application of various potentials applies voltages to various components. The driver 16 receives the potentials generated by the voltage generator 15, and supplies selected ones of the received potentials to the row decoder 20 in accordance with the control of the sequencer 14.

The row decoder 20 receives various potentials from the driver 16, receives the address signals from the input and output circuit 12, selects one block BLK based on a received address signal, and transfers the potentials from the driver 16 to the selected block BLK.

The sense amplifier 17 senses the states of the cell transistors MT and generates read data based on the sensed states, and transfers write data to the cell transistors MT. The data latch 19 stores write data from the input and output circuit 12, and supplies the write data to the sense amplifier 17. The data latch 19 also receives read data from the sense amplifier 17, and supplies the read data to the input and output circuit 12 in accordance with the control of the column decoder 18. The column decoder 18 controls the data latch 19 based on address signals.

<1.1.1. Cell Array>

FIG. 3 illustrates an example of some components and connections of the cell array 11, and illustrates details of one block BLK0 and associated components. Plural (for example, all) blocks BLK include the components and connections illustrated in FIG. 3.

One block BLK includes string units SU0 to SU3. Each of m bit lines BL0 to BLm−1 (m being a natural number) is coupled to strings STR respectively from the four string units SU0 to SU3 in each block BLK. Each string STR includes one select gate transistor ST (ST0 to ST3), plural (for example, eight) cell transistors MT0 to MT7, and one select gate transistor DT (DT0 to DT3). The transistors ST, MT, and DT are coupled in series in this order between the source line CELSRC and one bit line BL. A cell transistor MT includes a control gate electrode (word line WL) and a charge storage layer insulated from the environment, and can store data in a non-volatile manner based on the quantity of the electric charge in the charge storage layer. The cell transistors MT have electrons injected into their charge storage layers by writes.

Strings STR respectively coupled to different bit lines BL make one string unit SU. In each string unit SU, the gates of the cell transistors MT0 to MT7 are coupled to the word lines WL0 to WL7, respectively. In each block BLK, the word lines WL with the same address in the different string units SU are also coupled to each other. A set of cell transistors MT which share one word line WL in one string unit SU is referred to as a cell unit CU.

The transistors DT0 to DT3 belong to the string units SU0 to SU3, respectively. The transistors ST0 to ST3 belong to the string units SU0 to SU3, respectively.

For each of α (α being 0 or a natural number of no greater than four), the gate of each transistor DTα of each of strings STR of a string unit SUα is coupled to a select gate line SGDLα. For each of α, the gate of each transistor STα of each of strings STR of a string unit SUα is coupled to a select gate line SGSLα. Respective select gate lines SGSL of string units SU in one block BLK may be coupled to each other.

<1.1.2. Cell Transistors>

Referring to FIG. 4, the cell transistors MT are described. The memory device 100 can store data of one or more bits in one cell transistor MT. FIG. 4 illustrates distributions of threshold voltages of cell transistors MT each storing three bits as a result of a write, as an example. The threshold voltage of each cell transistor MT has a value according to stored three-bit data. In a case of storing of three-bits per cell transistor MT, each cell transistor MT can have one of eight threshold voltages. The eight threshold voltages are in states storing data 111, data 110, data 100, data 000, 010 data, data 011, data 001, and data 101, respectively. The association of eight threshold voltages and three-bit data is not limited to the FIG. 4 example.

The set of data in respective same-positioned bits of the cell transistors MT of one cell unit CU makes a page. The set of data in the respective most-significant bits of the cell transistors MT of one cell unit CU makes an upper page. The set of data in the respective middle bits of the cell transistors MT of one cell unit CU makes a middle page. The set of data in the respective least-significant bits of the cell transistors MT of one cell unit CU makes a lower page.

Even cell transistors MT storing the same particular three-bit data may have different threshold voltages due to variations of the cell transistors MT in properties, etc. Therefore, the threshold voltages of cell transistors MT storing the same particular data form a distribution. Distributions are referred to as Er, A, B, C, D, E, F, and G-levels. The threshold voltages in the A-level are higher than the threshold voltages in the Er-level. Similarly, the threshold voltages in the B, C, D, E, F, and G-levels are higher than the threshold voltages in the A, B, C, D, E, and F-levels, respectively. The Er-level is the distribution of the threshold voltages of cell transistors MT in an erased state.

In order for data in a cell transistor MT to be determined for a read, the level to which the threshold voltage of that cell transistor MT belongs is determined. For determination of a level, read voltages VA, VB, VC, VD, VE, VF, and VG are used. Hereinafter, a voltage of a particular value applied to a read-target cell transistor MT, including the voltages VA, VB, and VC, VD, VE, VF, and VG, may be referred to as a read voltage VCGR.

Whether the threshold voltage of a read-target cell transistor MT exceeds a particular read voltage VCGR is used to determine the level to which the threshold voltage of that cell transistor MT belongs. The read voltage VA is larger than the largest threshold voltage the Er-level cell-transistors MT have, is smaller than the smallest threshold voltage the A-level cell-transistors MT have, and is specifically located between the Er and A-levels. Similarly, the read voltages VB, VC, VD, VE, and VF are located between the A and B-levels, between the B and C-levels, between the C and D-levels, between the D and E-levels, between the E and F-levels, and between the F and G-levels, respectively. Cell transistors MT with threshold voltages larger than a read voltage VCGR remain off even when they receive the read voltage VCGR in the control gate electrodes. In contrast, cell transistors MT with threshold voltages smaller than a read voltage VCGR remain on while they are receiving the read voltage VCGR in the control gate electrodes. A voltage VREAD is applied to the word lines WL of cell transistors MT of a non-read-target cell unit CU, and is larger than the threshold voltages of cell transistor MT in any level.

<1.1.3. Sense Amplifier and Data Latch>

FIG. 5 illustrates components and connections of the sense amplifier 17 and the data latch 19. The sense amplifier 17 includes plural sense amplifier circuits 17*a*.

The sense amplifier circuits 17*a* all have the same set of components and connections. Each sense amplifier circuit 17*a* is coupled to one bit line BL. In a data read, each sense amplifier circuit 17*a* is electrically coupled to one read-target cell transistor MT via one (corresponding) bit line BL coupled to that sense amplifier circuit 17*a*. Based on the threshold voltage of the read-target cell transistor MT, a current of a particular magnitude flows into the corresponding bit line BL or a voltage of a particular magnitude appears on the bit line BL. Each sense amplifier 17*a* senses the current or voltage of the corresponding bit line BL, and determines to which of two states the corresponding cell transistor MT belongs based on the result of the sense. The two states of cell transistors MT are represented as data 0 and data 1, and each sense amplifier circuit 17*a* determines whether the read data is data 0 or data 1.

Such determination of data (sensed data) according to the state of a cell transistor MT and taking the same into a corresponding latch circuit 17*a* is referred to as a strobe. A strobe is triggered by a control signal (strobe signal) STB from outside the sense amplifier circuits 17*a*. A strobe occurs, for example, by assertion (transitioning to high level) of the strobe signal STB.

Each sense amplifier circuit 17*a* is coupled to one bus BUS, which is coupled to the data latch 19.

The data latch 19 includes data-latch-circuit groups DLG and a logical operation circuit LC. Each data latch circuit group DLG includes data latch circuits, and is coupled to one bus BUS. How many data latch circuits are included in one data latch circuit group DLG depends on another particular number, and will be described later. FIG. 5 and the following description are based on an example of one data latch circuit group DLG including eight data latch circuit DLCs (DL0 to DL7).

Each data latch circuit DLC can store data of one bit. Each data latch circuit DL0 stores sensed data determined by a corresponding sense amplifier circuit SAC coupled thereto.

Each of the data latch circuits DLC1 to DL7 receives one-bit data from the counter 14*a*. The counter 14*a* can count a number in as many bits as the data latch circuits DL without the data latch circuit DL0 in the one data latch circuit group DLG, i.e., DL1 to DL7 based on the ongoing example. Therefore, based on the ongoing example, the counter 14*a* can count a seven-bit number, and supplies the least significant first bit to the most significant seventh bit to the data latch circuits DL1, DL2, DL3, DL4, DL5, DL6, and DL7 in each data latch circuit set group DLG, respectively.

FIG. 6 illustrates an example of components and connections of the sense amplifier circuit SAC. As illustrated in FIG. 6, a bit line BL is coupled to a node SCOM via serially-coupled n-type MOSFETs QN1 and QN2. The transistors QN1 and QN2 receive signals BLS and BLC from the sequencer 14 at the gates, respectively.

The node SCOM is coupled to a node SRCGND via an n-type MOSFET QN4, which receives a signal INV_S from the sequencer 14 at the gate. The node SRCGND has a ground potential VSS.

The node SCOM is also coupled to a node of a power potential VDD via an n-type MOSFET QN5 and a p-type MOSFET QP1, which are coupled in series. The transistors QN5 and QP1 receive signals BLX and INV_S from the sequencer 14 at the gates, respectively. The node SCOM is further coupled to a node SEN via an n-type MOSFET QN7, which receives a signal XXL from the sequencer 14 at the gate.

The node SEN is coupled via an n-type MOSFET QN8 to a node SSRC between the transistors QN5 and QP1. The transistor QN8 receives a signal HLL from the sequencer 14 at the gate. The node SEN also receives a signal SACLK via a capacitor Csen. The node SEN is further coupled to a node LBUS via an n-type MOSFET QN11, which receives a signal BLQ from the sequencer 14 at the gate.

The Node LBUS is coupled to the data latch 19 (not shown), and is grounded via serially-coupled n-type MOS- FETs QN16 and QN17. The transistor QN16 receives a signal STB from the sequencer 14 at the gate. The transistor QN17 is coupled to the node SEN at the gate.

<1.2. Operations>

The memory device 100 can perform a read from a particular page in accordance with a specified one of plural types. The specification of a read type follows an instruction from the memory controller 200. The memory controller 200 reads data from the memory device 100, for example based on instructions from the host device 2. Reads follow the flow illustrated in FIG. 7. FIG. 7 illustrates an example of the flow of reads of data in the memory system of the first embodiment.

As illustrated in FIG. 7, the memory controller 200 instructs a first-type read to the memory device 100 (step S1). The first-type read specifies a data read from a particular page of the memory device 100. The page from which the data will be read is hereinafter referred to as a selected page. The first-type read is a fundamental one and will be described later in full detail. The memory interface 240 receives memory read data from the selected page.

The overall controller 220 uses the ECC circuit 250 and tries to correct errors in the memory read data (step S2). When no errors are detected or errors are correctable (Yes branch), the overall controller 220 obtains right host read data (i.e., including no errors) from the memory read data, and transmits the obtained host read data to the host device 2 (step S3). The flow ends after step S3.

When the errors in the memory read data are uncorrectable in step S2 (No branch), the memory controller 200 instructs a second-type read to the memory device 100 (step S4). The second-type read specifies a data read different from the first-type read from the selected page of the memory device 100. The second-type read will be described later in full detail. The read-target page of the second-type read in step S4 is the same page as that of the first-type read in step S1, for example. The memory interface 240 receives memory read data from the selected page.

The overall controller 220 tries to correct errors in the memory read data (step S5), as in step S2. When no errors are detected or errors are correctable (Yes branch), the flow shifts to step S3.

When the errors in the memory read data are uncorrectable in step S5 (No branch), the memory controller 200 instructs a third-type read to the memory device 100 (step S6). The third-type read specifies a data read different from the first and second-type reads from the selected page of the memory device 100. The third-type read will be described later in full detail. The read-target page of the third-type read in step S6 is the same page as that of the first-type read in step S1, for example. The memory interface 240 receives memory read data from the selected page.

The overall controller 220 tries to correct errors in the memory read data (step S7), as in step S2. When no errors are detected or errors are correctable (Yes branch), the flow shifts to step S3.

When the errors in the memory read data are uncorrectable in step S7 (No branch), the memory controller 200 instructs a fourth-type read to the memory device 100 (step S8). The fourth-type read specifies a data read different from the first to third-type reads from the selected page of the memory device 100. The fourth-type read will be described later in full detail. The read-target page of the fourth-type read in step S8 is the same page as that of the first-type read in step S1, for example. The memory interface 240 receives read memory read data from the selected page.

The overall controller 220 tries to correct errors in the memory read data (step S9), as in step S2. When no errors are detected or errors are correctable (Yes branch), the flow shifts to step S3.

When the errors in the memory read data are uncorrectable in step S9 (No branch), the memory controller 200 performs a further process (step S10), and the flow ends. The further process may include a further read with a product code or the memory controller 200 notifying the host device 2 of a failure of the instructed read, for example.

The description so far and FIG. 7 relates to the example of the second, third, and fourth-type reads occurring after the first-type read. However, the second, third, and fourth-type reads after the first-type read can occur in any order.

<1.2.1. First-Type Read>

The memory controller 200 transmits a first-type read instruction RI1 to the memory device 100 in order to instruct the first-type read to the memory device 100. The first-type read instruction RI1 is generated and transmitted to the memory device 100 from the memory interface 240 by the memory interface 240 and the command generator 241 under instructions of the overall controller 220, and instructs the first-type read.

FIG. 8 illustrates an example of the signal DQ flowing to the memory device 100 from the memory controller 200 for transmitting the first-type read instruction RI1 of the first embodiment. FIG. 8 also illustrates the signal DQ flowing to the memory controller 200 from the memory device 100 in response to the first-type read instruction RI1, and the signal RY/BYn. A first-type read instruction RI1 specifies one page and instructs to the memory device 100 a fundamental read from a selected page.

As illustrated in FIG. 8, the memory controller 200 sequentially transmits commands 01h and 00h. The signal CLE, which is not illustrated, is asserted during the transmission of the commands 01h and 00h. The command 00h instructs a normal read, for example, and the command 01h instructs that the read is the first-type, for example.

Alternatively, the memory device 100 may be configured to recognize the first-type read by the command 00h without the command 01h.

Following the command 00h, the memory controller 200 transmits address signals over five cycles. The address signals specify a read-target area in the memory space of the memory device 100. The signal ALE, which is not illustrated, is asserted during the transmission of the address signals. The address signals include column address signals CA (CA1 and CA2), for example in the first and second cycles. Column address signals CA include a column address, which specifies a read-target column of a specified page. The address signals include row address signals RA (RA1 to RA3), for example in the third to fifth cycles. Row address signals RA specify a row address, i.e., a selected page. The word line WL coupled to a cell unit CU including cell transistors MT which provide the memory space of a selected page, i.e., a selected cell unit CU, is referred to as a selected word line WL. The cell transistors MT in a selected cell unit CU are referred to as selected cell transistors MT.

The memory controller 200 transmits a command 30h following the row address signal RA3. The command 30h instructs executing the operation specified by the set of commands 01h and 00h, i.e., the first-type read, for example. When the sequencer 14 receives the command 30h, it performs the first-type read to the selected cell unit CU. The first-type read will be described later. The memory device 100 outputs the busy signal during the execution of the first-type read. As a result of the first-type read, read data (D0, . . . , Dn) is obtained in the memory device 100. The memory controller 200 repeatedly asserts the signal REn (not shown) to make the memory device 100 output the read data, and receives the output read data.

The first-type read is described with reference to FIGS. 9 to 23. The first-type read includes steps S11 to S3, as illustrated in FIG. 9. FIG. 9 illustrates the flow of the first-type read of the memory device 100 of the first embodiment. In step S11, the sequencer 14 applies the selected word line WL over time with a voltage, for example a voltage with a continuously rising level, performs plural strobes during the application of the voltage to the selected word line WL, and counts strobes performed before plural (for example, all) selected cell transistors MT turn on.

In step S12, the sequencer 14 performs plural strobes with a first-type timing, and estimates one or more respective threshold voltages which select cell transistors MT of one or more relative minimum numbers have (relative minimum voltages).

In step S13, the sequencer 14 determines read data of the selected page, using the estimated relative minimum voltages as read voltages, and outputs the determined read data. The details of steps S11 to S13 will now be described with reference to FIGS. 10 to 16.

<1.2.1.1. Step S11>

FIG. 10 illustrates over time voltage applied to the selected word line WL (selected word line voltage) in step S11, and the signal STB over time. The sequencer 14 controls the voltage generator 15, the driver 16, and the row decoder 20, to apply the voltage illustrated in FIG. 10 to the selected word line WL. In contrast, the sequencer 14 applies the voltage VREAD to word lines WL other than the selected word line WL (unselected word lines WL) during the application of the voltage of FIG. 10. Moreover, during the application of the voltage of FIG. 10, the sequencer 14 controls the voltage generator 15, the driver 16, and the row decoder 20, to apply the voltage VSG to the select gate lines SGDL and SGSL of the string unit SU including the selected cell unit CU. The voltage VSG has a magnitude which turns on the transistors DT and ST.

As illustrated in FIG. 10, the sequencer 14 applies the selected word line with a voltage of a magnitude which keeps rising from time t0 to time t100. The magnitude Vm of the selected word line voltage at time t100 is at least larger than the threshold voltage of a cell transistor MT which may be included in the largest threshold voltage distribution (level). The inclination of the rise of the selected word line voltage is substantially constant, and is substantially constant from a time t0 to a time t100, for example.

After a time P1 lapses from the start of the rise of the selected word line voltage (at the time t0), the sequencer 14 asserts the signal STB periodically over the rise of the selected word line voltage. The assertion (rise) of the signal STB repeatedly occurs till the time t100, and occurs N times at the maximum.

In the specification and claims, "continuously" is defined as follows. The selected word line voltage rising continuously rises step-wise in micro perspective. However, as long as it repeatedly rises step-wise and plural (for example, all) assertions of the signal STB respectively occur during different voltages, the voltage is described as "continuously" rising.

The interval C of assertions of the signal STB, i.e., the cycle of the signal STB, has the minimum duration possible for the memory device 100, for example. In other words, the sequencer 14 asserts the signal STB in the highest possible frequency. The minimum possible length for the interval of the risings of the signal STB depends on the performance of the memory device 100, and is static. The duration of the time P1 comes to an end before the selected word line voltage reaches the default read voltage VA. Specifically, it ends before the selected word line voltage exceeds the threshold voltage which should be the smallest in the A-level, for example.

The periodic assertions of the signal STB make each sense amplifier circuit SAC perform strobes periodically. Each sense amplifier circuit SAC overwrites the result of its own strobe (data 0 or data 1) in the latch circuit DL0 connected thereto. Each sense amplifier circuit SAC outputs data 1 when the selected cell transistor MT connected thereto (or a corresponding selected cell transistor MT) is OFF while receiving the selected word line voltage at the gate upon an assertion of the signal STB. In contrast, each sense amplifier circuit SAC outputs data 0 when the corresponding selected cell transistor MT is ON while receiving the selected word line voltage at the gate upon an assertion of the signal STB.

As described above, the inclination of the selected word line voltage is constant. For this reason, the selected word line voltage at a strobe at a particular timing is fixed based on the inclination, and the difference of respective selected word line voltages at two successive assertions of the signal STB is also constant. Specifically, the difference of respective read voltages VCGR at two successive strobes is ΔVCGR of a fixed magnitude, and strobes are performed for every rise of the difference ΔVCGR.

The number of times of assertions of the signal STB is counted by the counter 14*a*. The counter 14*a* stores a value incremented by one at every assertion from the start of the rise of the selected word line voltage. The value in the counter 14*a* at a particular time indicates the serial number (a strobe number or strobe ID) of assertions of the signal STB from the start of the counting.

FIG. 11 illustrates further operations of the sequencer 14 and the states of the latch circuits DL in step S11. The sequencer 14 performs the operations of FIG. 11 in parallel to the operations of FIG. 9. Each of boxes lined up horizontally with the notation "DL0" in FIG. 10 represents one data latch circuit DL0. The value in each data latch circuit DL0 indicates the stored data. Each of boxes lined up horizontally with the notation "DL1 to DL7" in FIG. 11 represents a set of the coupled data latch circuits DL1 to DL7, which will be referred to as a data latch circuit set DLS. The value in each data latch circuit set DLS indicates the value represented by the set of one-bit data each stored in each of the data latch circuits DL1 to DL7 in a decimal number.

As illustrated in FIG. 11, when the value in a particular data latch circuit DL0 changes from "1" to "0", the sequencer 14 sets the value in the counter 14*a* (i.e., the strobe number) at that time in the data latch circuit set DLS coupled to that data latch circuit DL0. For example, FIG. 11(A) illustrates the state after the fourth strobe from the start of the rise of the word line voltage with the start of a first-type read. As illustrated in FIG. 11(A), the counter 14*a* stores the value of four. The data latch circuit DL0 coupled to the bit line BL1 stores data 1. In other words, the selected cell transistor MT coupled to the bit line BL1 in the selected cell unit CU remains off even while it is receiving the selected word line voltage at the gate electrode at the fourth strobe. The same holds true for the data latch circuits DL0 coupled to the bit lines BL2 to BL5, and the data latch circuits DL0 coupled to those bit lines BL store data 1 respectively. In contrast, the selected cell transistor MT coupled to the bit line BL0 receives the selected word line voltage at the gate at the fourth strobe and turned on. Therefore, the corresponding data latch circuit DL0 stores “0”, and the corresponding set of the data latch circuits DL1 to DL7 stores the value of four.

FIG. 11(B) illustrates the state after the fifth strobe. While transitioning from the FIG. 11(A) state to the FIG. 11(B) state, the selected word line voltage rises. As a result, some selected cell transistors MT (for example, those coupled to the bit lines BL1, BL2, and BL4) receive the selected word line voltage at the gates at the fifth strobe and turn on. As a result, the data latch circuits DL0 corresponding to the bit lines BL1, BL2, and BL4 now store data 0, and the data latch circuit sets DLS respectively corresponding to the bit line BL1, BL2, and BL4 now store the value of five. Note that FIG. 11 illustrates an example where some particular values concentrate in the illustrated data latch circuit sets DL1 to DL7 for convenience of illustration and description.

Figure 12:
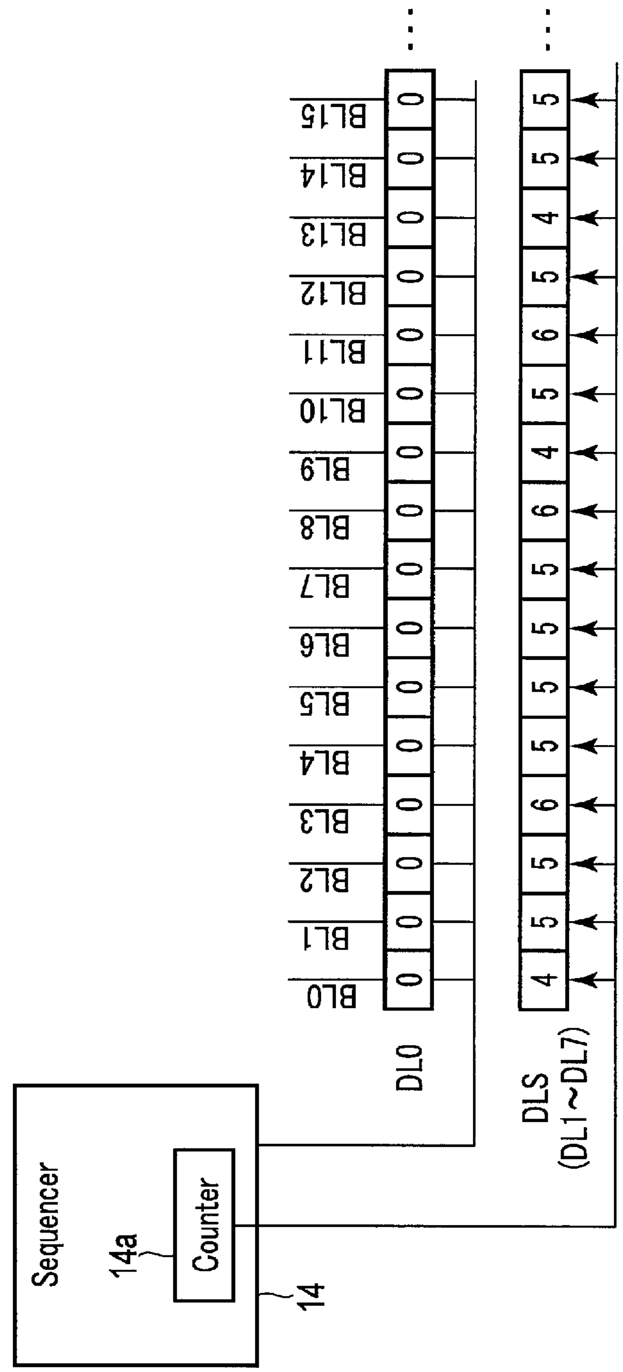
FIG. 12 illustrates an example of states of data latches during the first-type read of the memory device of the first embodiment.

As a result of the selected word line voltage completing the rise, all data latch circuit sets DLS store respective strobe numbers when the corresponding select cell transistors MT turn on for the first time from the start of the rise of the selected word line voltage. FIG. 12 illustrates such a state and illustrates only some data latch circuits DL0 and some data latch circuit sets DL1 to DL7. FIG. 12 also illustrates an example where some particular values concentrate in the illustrated data latch circuit sets DL1 to DL7 for convenience of illustration and description.

<1.2.1.2. Step S12>

Prior to description of step S12, the background of step S12 is described with reference to FIGS. 13 to 14. FIG. 13 illustrates transitions of the A and B-levels of distributions of the threshold voltages of cell transistors MT in a particular cell unit CU over time. Assume that the threshold voltage distributions immediately after writes of the A and B-levels are as illustrated in FIG. 13(A), as an example. Assume that the threshold voltage distributions change due to a lapse of time and/or disturbs to result in the state illustrated in FIG. 13(B). A read in the FIG. 13(B) state using a read voltage VB cannot correctly determine levels to which the cell transistors MT corresponding to the shadowed area in FIG. 13(B) belong. Specifically, the read using the read voltage VB leads to erroneous determination of the states of many cell transistors MT, and bits by extension. In contrast, a read using a read voltage VB' at the intersection of two distributions leads to the minimum count of errors. The intersection corresponds to a relative minimum point of the threshold distribution curve.

A relative minimum can be determined from the information obtained by step S11. As described above, the value in each data latch circuit set DLS illustrated in the FIG. 12 and obtained by step S11, i.e., the strobe number, specifies one corresponding selected word line voltage, and is the strobe number when the corresponding selected cell transistor MT turns on for the first time from the start of the rise of the selected word line voltage. For this reason, the selected word line voltage specified from the value in a data latch circuit set DLS can be presumed to be the threshold voltage of the corresponding selected cell transistor MT. Therefore, using data latch circuit sets DLS, the sequencer 14 is in the state equivalent to knowing, for each of plural threshold voltages as illustrated in FIG. 14, the estimated count of selected cell transistors MT which have that threshold voltage. Therefore, the sequencer 14 can estimate relative minimum points through comparisons of the values in the data latch circuit sets DLS. In turn, the threshold voltage of the transistors MT of a relative minimum count in a particular range (i.e., the relative minimum voltage) can be used as a read voltage. FIG. 14 illustrates a range including the smallest relative minimum voltage, and the smallest relative minimum is formed by the A and B-levels and the smallest relative minimum voltage VB' can be used as the voltage VCGR.

Figure 15:
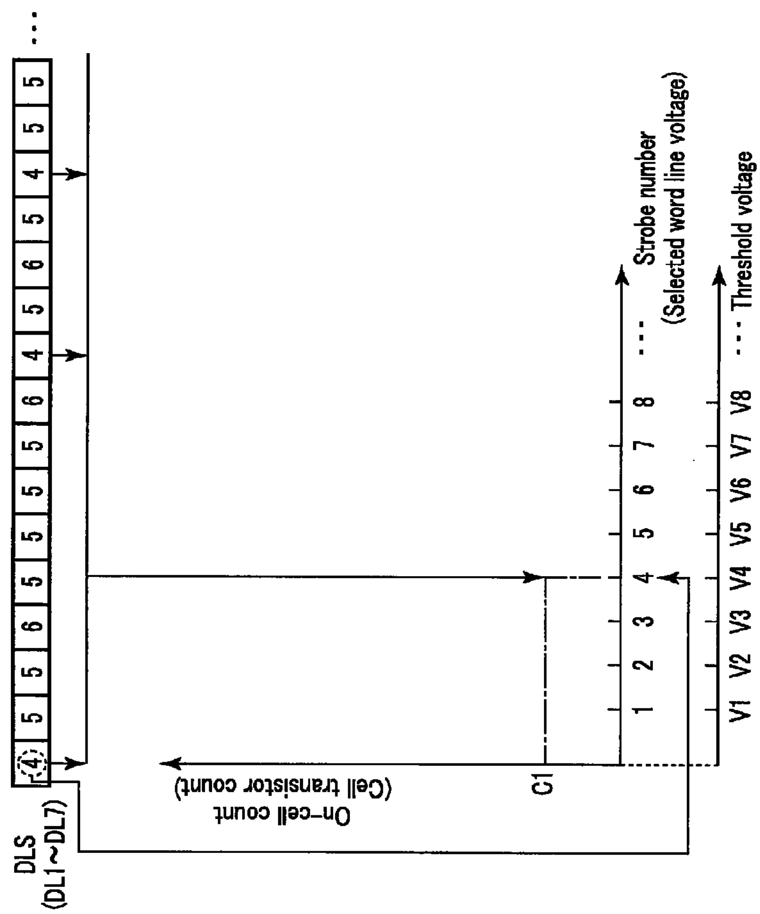
FIG. 15 illustrates obtaining relationships between strobe numbers and on-cell counts in the memory device of the first embodiment.
Figure 16:
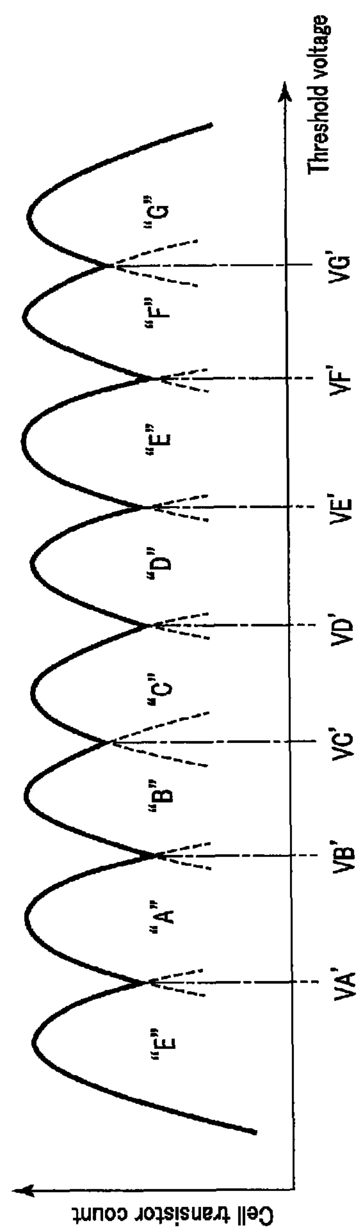
FIG. 16 illustrates voltages of estimated relative minimums in the memory device of the first embodiment.

The sequencer 14 uses the values in the data latch circuit sets DLS obtained in step S11 and calculates seven relative minimum voltages in step S12 through the comparisons described with reference to FIG. 14. The details are as follows. Assume that the strobe numbers when selected cell transistors MT turn on are as illustrated in FIG. 12. Then, counting data latch circuit sets DLS storing a particular strobe number (for example, four) allows the count (C1) of the selected cell transistors MT which turned on (on-cells) for the first time from the start of the rise of the selected word line voltage at that strobe number (four) to be obtained as illustrated in FIG. 15. As described above, each strobe number can be translated into a selected word line voltage at that specified strobe, and the converted selected word line voltage can be estimated to be the threshold voltage of the cell transistors which turned on at that strobe number. Therefore, the relationship between a strobe number and the on-cell count is the same as the relationship between a threshold voltage and the selected cell transistor count, and thus plural sets of a threshold voltage and the count of the selected cell transistors MT with that threshold voltage can be estimated. An example of the result is illustrated in FIG. 16. The curve in FIG. 16 has the same characteristics that in FIG. 14. Seven estimated relative minimum voltages are referred to as voltages VA', VB', VC', VD', VE', VF', and VG' in this order from the smallest one.

<1.2.1.3. Step S13>

In the first-type read, reads with the voltages VA', VB', VC', VD', VE', VF', and VG' lead to the minimum error counts. Based on this, the sequencer 14 performs the first-type read with the voltages VA', VB', VC', VD', VE', VF', and VG' which assume the roles of the read voltages VA, VB, VC, VD, VE, VF, and VG, respectively. Specifically, the sequencer 14 stores the voltages VA', VB', VC', VD', VE', VF', and VG' in the register 14*b*. The sequencer 14 then uses the voltage VA' to determine whether the threshold voltage of a select cell transistor MT belongs to the A-level and higher levels or not, as the read voltage VA. The same holds true for the voltages VB', VC', VD', VE', VF', and VG'. After the read voltages VA', VB', VC', VD', VE', VF', and VG' are stored in the register 14*b*, the data in the data latch circuits DL0 to DL7 can be overwritten.

The sequencer 14 then obtains the data of the selected page specified by the first-type read instruction. The data of lower pages is determined using voltage VA' and VE'. Each bit of a lower page is binary 1 when the corresponding selected cell transistor MT has a threshold voltage smaller than the voltage VA' or a threshold voltage equal to or larger than the voltage VE, and binary 0 when it has a threshold voltage equal to or larger than the voltage VA' and smaller than the voltage VE', as can be seen from FIG. 4.

The data of a middle pages is determined using the voltages VB', VD', and VF'. Each bit of a middle page is binary 1 when the corresponding selected cell transistor MT has a threshold voltage smaller than the voltage VB' or a threshold voltage equal to or larger than the voltage VD' and smaller than the voltage VF', and binary 0 when it has a threshold voltage equal to or larger than the voltage VB' and smaller than the voltage VD' or a threshold voltage equal to or larger than the voltage VF', as can be seen from FIG. 4

The data of an upper pages is determined using the voltages VC' and VG'. Each bit of an upper page is binary 1 when the corresponding selected cell transistor MT has a threshold voltage smaller than the voltage VC' or a threshold voltage equal to or larger than the voltage VG', and binary 0 when it has a threshold voltage equal to or larger than the voltage VC' and smaller than the voltage VG', as can be seen from FIG. 4.

The read data determined in this way is transmitted to the memory controller 200 from the memory device 100 as the data D1, D2, . . . , Dn.

<1.2.2. Second to Fourth-Type Read Instructions>

The memory controller 200 transmits a second-type read instruction RI2, a third-type read instruction RI3, and a fourth-type read instruction RI4 to the memory device 100, in order to instruct the second to fourth-type reads to the memory device 100, respectively. The second to fourth-type read instructions RI2 to RI4 are generated and transmitted to the memory device 100 from the memory interface 240 by the memory interface 240 and the command generator 241 under instructions of the overall controller 220, and instruct the second to fourth-type reads, respectively. The second to fourth-type read instructions RI2 to RI4 specify one page, and instruct reads from a selected page to the memory device 100, as the first-type read instruction RI1.

FIGS. 17 to 19 illustrate the signal DQ flowing to the memory device 100 from the memory controller 200 for transmitting the second to fourth-type read instructions RI2 to RI4 of the first embodiment, respectively. FIGS. 17 to 19 also illustrate the signal DQ flowing to the memory controller 200 from the memory device 100 in response to the second to fourth-type read instructions RI2 to RI4, and the signal RY/BYn.

As illustrated in FIG. 17, the second-type read instruction RI2 includes successive commands XXh and X1h preceding the command 00h. The commands XXh and X1h instruct the second-type read in conjunction with the command 00h. Subsequent to the command 00h, the address signals which specify a read-target area and the command 30h flow, as the first-type read instruction RI1. When the memory device 100 receives the commands XXh and X1h before the command 00h, it recognizes an instruction of the second-type read. The second-type read will be described later.

As illustrated in FIG. 18, the third-type read instruction RI3 includes successive commands XXh and X2h preceding the command 00h. The commands XXh and X2h instruct the third-type read in conjunction with the command 00h. Subsequent to the command 00h, the address signals which specify a read-target area and the command 30h flow, as the first-type read instruction RI1. When the memory device 100 receives the commands XXh and X2h before the command 00h, it recognizes an instruction of the third-type read. The third-type read will be described later.

As illustrated in FIG. 19, the fourth-type read instruction RI4 includes successive commands XXh and X3h preceding the command 00h. The commands XXh and X3h instruct the fourth-type read in conjunction with the command 00h. Subsequent to the command 00h, the address signals which specify a read-target area and the command 30h flow, as the first-type read instruction RI1. When the memory device 100 receives the commands XXh and X3h before the command 00h, it recognizes an instruction of the fourth-type read. The fourth-type read will be described later.

<1.2.2.1. Second to Fourth Type Reads>

The second to fourth-type reads include steps S21, S12, and S13, as illustrated in FIG. 20. Step S21 differs from the first-type read in the timing of the first assertion of the signal STB, and the remaining points are the same as those in step S11 (the first-type read). Moreover, the second to fourth-type reads differ in the timing of the first assertion of the signal STB.

FIGS. 21(B), 21(C), 21(D), and 21(E) illustrate the waveforms of the signal STB in the first to fourth-type reads over time, respectively. The time t0 in FIGS. 21(B) 21(C), 21(D), and 21(E) is the time t0 when the selected word line voltage starts rising (see, FIG. 10). The selected word line voltage is also illustrated in FIG. 21(A).

The cycles C of assertion of the signals STB in the first to fourth-type reads are the same.

As described above and illustrated in FIG. 21(B), in the first-type read, the first assertion of the signal STB occurs after the time P1 lapses from the time t0. In contrast, as respectively illustrated in FIG. 21(C) to 21(E), in the second to fourth-type reads, the first assertions of the signals STB occur after times P2 to P4 lapse from the time t0, respectively. The time P2 is longer than the time P1 by (the cycle C)/4. The time P3 is longer than the time P2 by (the cycle C)/4. The time P4 is longer than the time P3 by (the cycle C)/4. In other words, the first strobes of the first, second, third, and fourth-type reads occur in this order with a delay of a fourth of the cycle C.

<1.3. Advantages>

FIG. 22 illustrates an example of counts of selected cell transistors with respective threshold voltages estimated from the result of the first-type read. As illustrated in FIG. 22(B), the first-type read and application of the voltage of the different values to a selected word line WL can produce plural counts of selected cell transistors MT estimated to have respective threshold voltages equal to those selected word line voltages. The counts of selected transistors obtained are discrete. The difference between the threshold voltages which a pair of counts of selected cell transistors are estimated to have is the difference ΔVCGR, which depends on the cycle of signal STB. Therefore, as illustrated in FIGS. 22(A) and 22(B), the timings when the counts of selected cell transistors are estimated depend on the timings of the rises of the signal STB.

The sequencer 14 determines a relative minimum of the distribution curve of the threshold voltages of the selected cell transistor MT based on the plural discrete counts of selected cell transistors illustrated in FIG. 22(A). As described above, the count of selected cell transistors MT with a particular threshold voltage depends on the counts of the selected cell transistors which receive a voltage as large as that threshold voltage at the selected word line and turn on, and the count of selected cell transistors MT estimated to have a particular threshold voltage depends on a timing when the selected word line voltage is that threshold voltage. In turn, the timing when the selected word line voltage is a particular threshold voltage depends on the timing of an assertion of the signal STB. Therefore, timings when the counts of selected cell transistors MT are calculated depend on the timings of assertions of the signal STB. Note that FIG. 22(B) illustrates an actual distribution of threshold voltages with a continuous broken curve.

According to such an actual threshold voltage distribution curve as in FIG. 22(B), the relative minimum corresponds to the voltage VA', and a read with the voltage VA' leads to the minimum errors. However, according to estimation based on the number of selected cell transistors as in FIG. 22(B), the voltage at the relative minimum is VAe. For this reason, the memory read data obtained by a read with the voltage VAe includes many errors and may be error-uncorrectable by the ECC circuit 250. This leads to failure of the read.

In contrast, unlike the FIG. 22 example, some combinations of a timing of a strobe and a threshold voltage distribution curve may produce the count of selected cell transistors right at a relative minimum of a threshold voltage distribution curve. Therefore, whether a read is performed with the optimum read voltage (the voltage corresponding to the relative minimum point of a threshold voltage distribution curve) depends on the combination of a threshold voltage distribution curve of selected cell unit CU and the timing of a strobe.

In order for the count of cell transistors at a relative minimum of a threshold voltage distribution curve to be obtained, a strobe when the same voltage as the threshold voltage of that count of cell transistors is applied to the selected word line WL is necessary. To this end, strobes can be performed with a shorter cycle; however the interval C of strobes is posed with restrictions of a lower limit as described above. In order to obtain the respective cells transistor counts at more threshold voltages using the signal STB with a cycle with a lower limit, a rise of the selected word line voltage value of a smaller inclination can be used. However, the inclination of the rise of the selected word line voltage value needs to be constant and fixed within the memory device 100 regardless of types of operations. For this reason, a smaller inclination of the rise results in a uniformly prolonged time for all reads.

In contrast, as illustrated in FIG. 23(B), strobe timings different from those in FIG. 23(A) may result in a successful read. However, with fixed timings of strobes, if a particular read fails, the memory device 100 cannot perform strobes with other timings thereafter. Specifically, the memory device 100 cannot perform a further read with an optimized read voltage, but must rely on a read of completely different techniques for a successful read (for example, use of a product code).

According to the first embodiment, the memory controller 200 and the memory device 100 can instruct and perform plural types of reads which cause plural types of strobes which differ in start timing and have the smallest cycle possible in the memory device 100. When a read of a particular type succeeds, the memory controller 200 completes the read, which allows for the read with the smallest cycle, i.e., in the shortest time. In contrast, it performs another type of read when the read with the first-type fails. Another type of read differs in first strobe timing of FIG. 23(A), and therefore another set of magnitudes of selected word line voltage different from those in the first read is used, as illustrated in FIG. 23(B). FIG. 23(B) illustrates the example of the third-type read. In the read with the strobe timings of FIG. 23(B), the cell transistor count of the threshold voltage VA' at the relative minimum of the threshold voltage distribution curve is obtained, as illustrated in FIG. 23 (C). Therefore, a read with the voltage corresponding to the relative minimum of the threshold voltage distribution curve, i.e., an optimum read, is performed, which increases a possibility of a successful read. Therefore, the memory controller 200 and the memory device 100 can have a means for more optimum reads through more optimized read voltages while realizing reads in a short time through minimum cycle strobe timings.

<1.4. Modification>

Strobes may be performed with timings different from FIG. 10, as illustrated in FIG. 24. FIG. 24 illustrates another example of a selected word line voltage and the signal STB in step S11 over time. As illustrated in FIG. 24, the sequencer 14 does not assert the signal STB with the cycle C, but only in particular timings of the cycle C. Specifically, the sequencer 14 performs strobes, for example one to three times around the time of a selected word line voltage expected to turn on a relative minimum number of cells. In other words, the selected word line voltage expected to turn on selected cell transistors MT of a relative minimum number can be in advance estimated with a certain degree of a high accuracy based on the properties of the memory device 100 and simulations or experiments. Then, a time for the selected word line voltage to reach the estimated value from the start of the rise (time t0) can be determined from the inclination of the rise of the selected word line voltage. The sequencer 14 performs strobes once or twice in total, including a strobe at the timing nearest to the time after lapse of the time determined from the start of the rise, and another strobe around the first one. FIG. 24 illustrates an example where two strobes are performed within a range around a time when as many selected cell transistors MT as each relative minimum turns on.

The timing of assertion of the first of two successive assertions of each set (pair) is static, and the interval of adjacent assertion-pairs is also static. Specifically, the interval from a first assertion to the first assertion of the next assertion pair is the time ΔT1, and the interval of the first assertion of the $j^{th}$ assertion pair (j being a natural number) along time and that of the $j+1^{th}$ assertion pair is the time ΔTj.

The waveforms of the signal STB in the first to fourth-type reads are as illustrated in FIG. 25(B) FIG. 25(C) FIG. 25(D), and FIG. 25(E), respectively. The first assertions of the signal STB in the first to fourth-type reads of the modification occur after the time P1 to P4 from the start of the rise of the selected word line voltage. After that, in any of the first to fourth-type reads, an assertion pair occurs after lapses of time ΔT1 to ΔT7. In other words, the timings of assertions of the signal STB of the first to fourth-type reads differ only in the timing of first assertion.

With the strobes as in FIGS. 24 and 25, the timings of the strobes in the first and third-type reads are as shown in FIG. 26. FIG. 26 is similar to FIG. 23. FIGS. 26(A) and 26(B) illustrate an example of one strobe around the time when the select transistors MT of count of a relative minimum number turn on with a solid line, and an example of two strobes with the solid line and a broken line.

According to the modification, the largest strobe number is smaller, and therefore there are fewer data latch circuits DL for each data latch group DLG to store a strobe number.

Second Embodiment

The second embodiment differs from the first embodiment in output of information which may be used for reads instead of read data.

A memory system 1 of the second embodiment includes the memory device 100 and the memory controller 200, as the memory system 1 of the first embodiment. Furthermore, the memory device 100 and the memory controller 200 of the second embodiment include the same functional blocks as those of the memory device 100 and the memory controller 200 of the first embodiment. The memory device 100 and the memory controller 200 are, however, configured to perform operations described in the following.

The memory device 100 can perform the first-type read of the first embodiment at least. Furthermore, the memory device 100 can recognize the first-type read with the command 00h without the command 01h transmitted, and in particular performs the first-type read in response to reception of the first-type read instruction RI1 (see, FIG. 8) without the command 01h.

<2.1. Relative Minimum Point Information Read>

The memory controller 200 instructs the memory device 100 to obtain particular information which may be used for reads and to output the obtained information, autonomously without instructions from the host device 2 or in response to a predetermined algorithm, for example. The information obtained and output is related with estimated relative minimum points of a threshold voltage distribution curve of a selected cell unit CU, and is referred to as relative minimum point information. FIG. 27 illustrates the flow of a read of relative minimum information in the memory system of the second embodiment.

As illustrated in FIG. 27, in step S31, the memory controller 200 instructs the memory device 100 to determine relative minimum point information. The relative minimum point information includes counts of the selected cell transistors MT at one or more relative minimum points of a distribution curve of the threshold voltages of plural (for example, all) selected cell transistors MT (relative minimum cell counts), and includes strobe numbers each of which specifies a strobe when the selected word line WL is applied with the same voltage as the threshold voltage which selected cell transistors MT of the count at a relative minimum point have (relative minimum strobe numbers). With step S31, the sequencer 14 comes to store the relative minimum information in the register 14*a*.

The memory controller 200 instructs the memory device 100 to output the relative minimum information (step S32), and receives the same.

Each step will now be described in detail.

<2.1.1. Step S31 (Relative Minimum Information Determination)>

An instruction for relative minimum point information determination (relative minimum point information determination instruction) specifies one selected cell unit CU, and instructs the determination of plural sets of a count of relative minimum cells and a relative minimum strobe number for the selected cell unit CU. The count of the relative minimum points on each of which a relative minimum cell count and a relative minimum strobe number is based is smaller than the count of distributions (levels) of threshold voltages by one, and is seven in the ongoing example. The following description is based on this example. The memory controller 200 transmits a relative minimum point information determination instruction LMD to the memory device 100, in order to instruct the determination of relative minimum point information. The relative minimum point information determination instruction LMD is generated and transmitted to the memory device 100 from the memory interface 240 by the memory interface 240 and the command generator 241 under instructions of the overall controller 220, and instructs relative minimum point information determination.

FIG. 28 illustrates an example of the signal DQ flowing to the memory device 100 from the memory controller 200 for transmitting the relative minimum point information determination instruction LMD of the second embodiment. As illustrated in FIG. 28, the memory controller 200 transmits a command YYh preceding the command 00h. It then transmits address signals over five cycles. The address signals specify a selected cell unit CU, or a selected word line WL in actuality.

The memory controller 200 transmits the command 30h following the address signal RA3. The command 30h instructs, for example, the execution of the operation specified by the set of commands YYh and the 00h, i.e., the relative minimum point information determination. When the sequencer 14 receives the command 30h, it determines the relative minimum point information for the selected cell unit CU. The determination of relative minimum point information will be described later. The memory device 100 outputs the busy signal while it is determining the relative minimum point information.

Referring to FIG. 29, the determination of relative minimum point information will be described. When the memory device 100 receives the relative minimum point information determination instruction LMD, it performs an operation of FIG. 29. FIG. 29 illustrates an example of the flow of the relative minimum point information determination of the second embodiment. The relative minimum point information determination includes steps S11, S312, and S313, as illustrated in FIG. 29. In step S11, as described in the first embodiment, the sequencer 14 counts strobes performed by the time each select transistor MT turns on. As a result of step S11, all the data latch circuit sets DLS stores strobe numbers when the corresponding selected cell transistor MT turns on for the first time.

In step S311, the sequencer 14 uses the values in the data latch circuit sets DLS to estimate seven relative minimum points of a threshold voltage distribution curve. Step S311 is similar to step S12 of the first embodiment. Specifically, the sequencer 14 determines seven counts of select cell transistors at relative minimums through the same comparison as described with reference to FIG. 15.

In step S312, as illustrated in FIG. 30, the sequencer 14 stores the seven determined counts of selected cell transistors of relative minimums as the relative minimum cell counts in the register 14*b*. Moreover, the sequencer 14 stores respective strobe numbers for the seven estimated counts of selected cell transistors of relative minimums as the relative minimum strobe numbers in the register 14*b*. The sets of the relative minimum cell count and the corresponding relative minimum strobe number are stored in the register 14*b* in areas with addresses of ascending order.

<2.1.2. Step S32 (Relative Minimum Information Output Instruction)>

The memory controller 200 transmits a relative minimum point information output instruction LMO to the memory device 100, in order to instruct the output of relative minimum point information. The relative minimum point information output instruction LMO includes a command instructing the output of relative minimum point information and information identifying the area in the register 14*b* storing the relative minimum point information requested by the memory controller 200. The relative minimum point information output instruction LMO is generated and transmitted to the memory device 100 from the memory interface 240 by the memory interface 240 and the command generator 241 under instructions of the overall controller 220, and instructs outputting relative minimum point information.

FIG. 31 illustrates an example of the signal DQ flowing to the memory device 100 from the memory controller 200 for transmitting the relative minimum point information output instruction. FIG. 31 also illustrates an example of the signal DQ flowing to the memory controller 200 from the memory device 100 for transmitting the relative minimum point information. As illustrated in FIG. 31, the memory controller 200 transmits commands WWh and an address signal A1 to the memory device 100. The command WWh instructs outputting relative minimum point information. The address signal A1 identifies an area in the register 14*b*.

Specifically, the address signal A1 identifies the area storing the relative minimum information for one relative minimum point in the register 14.

When the memory device 100 receives the relative minimum point information output instruction, it outputs the specified relative minimum point information. Specifically, the memory device 100 transmits the relative minimum strobe number and the relative minimum cell count stored in the specified area in the register 14*b* to the memory controller 200 whenever the signal REn (not shown) is asserted.

<2.2. Modification>

The description of the second embodiment so far relates to the example of the memory device 100 supporting the first-type read. Specifically, the memory device 100 of the second embodiment continuously raising the selected word line voltage in response to the first-type read instruction RI1, as described in the first embodiment.

Figure 32:
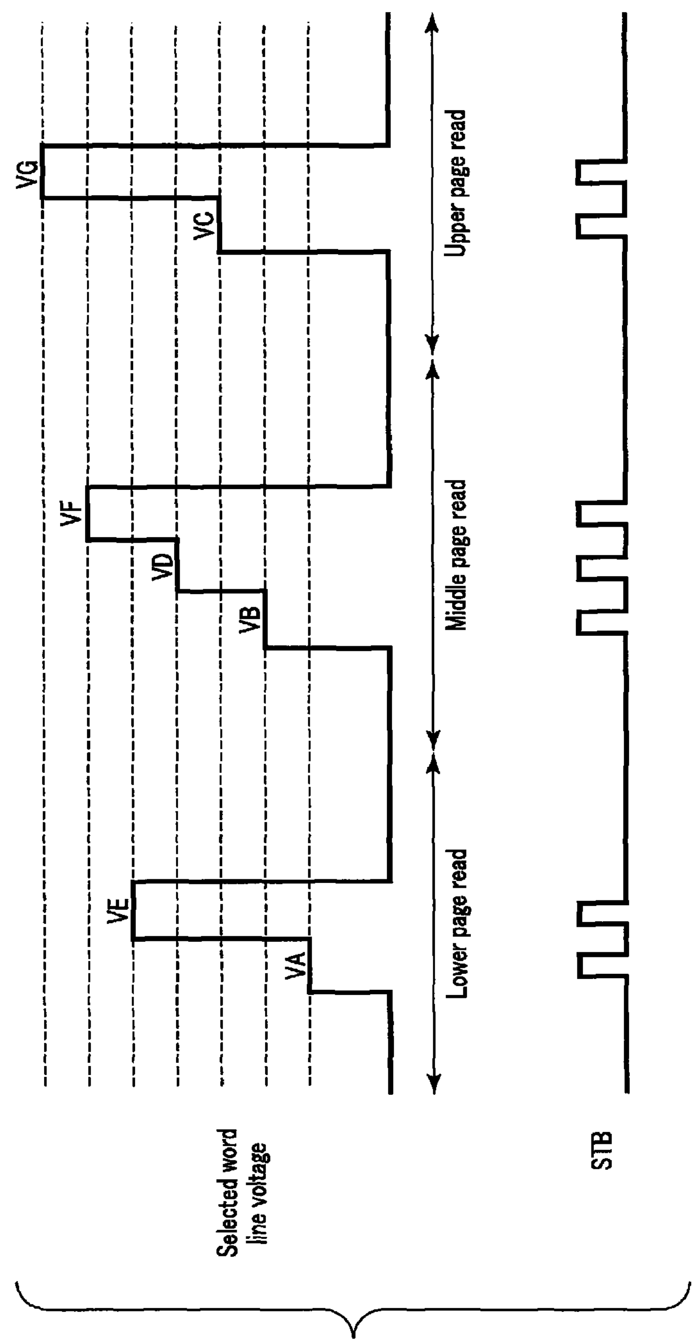
FIG. 32 illustrates a selected word line voltage and the signal STB during a read of a memory device of a modified second embodiment over time.

In contrast, the memory device 100 of the modification does not use the continuous rise of selected word line voltage in response to reception of the first-type read instruction RI1 (with or without the command 01h), and does not support a read with a continuous rise of selected word line voltage. Instead, when the memory device 100 of the modification receives the first-type read instruction RI1, it raises the selected word line voltage step-wise and performs a strobe once during a period over which the selected word line voltage is substantially flat, as illustrated in FIG. 32. FIG. 32 illustrates the selected word line voltage and signal STB during a read of the memory device 100 of a modified second embodiment over time.

As illustrated in FIG. 32, the voltage of the selected word line WL is raised step-wise regardless of a page to be read. Specifically, plural read voltages determined based on a to-be-read page are used, and each of the voltages used is maintained for a particular period.

Figure 34:
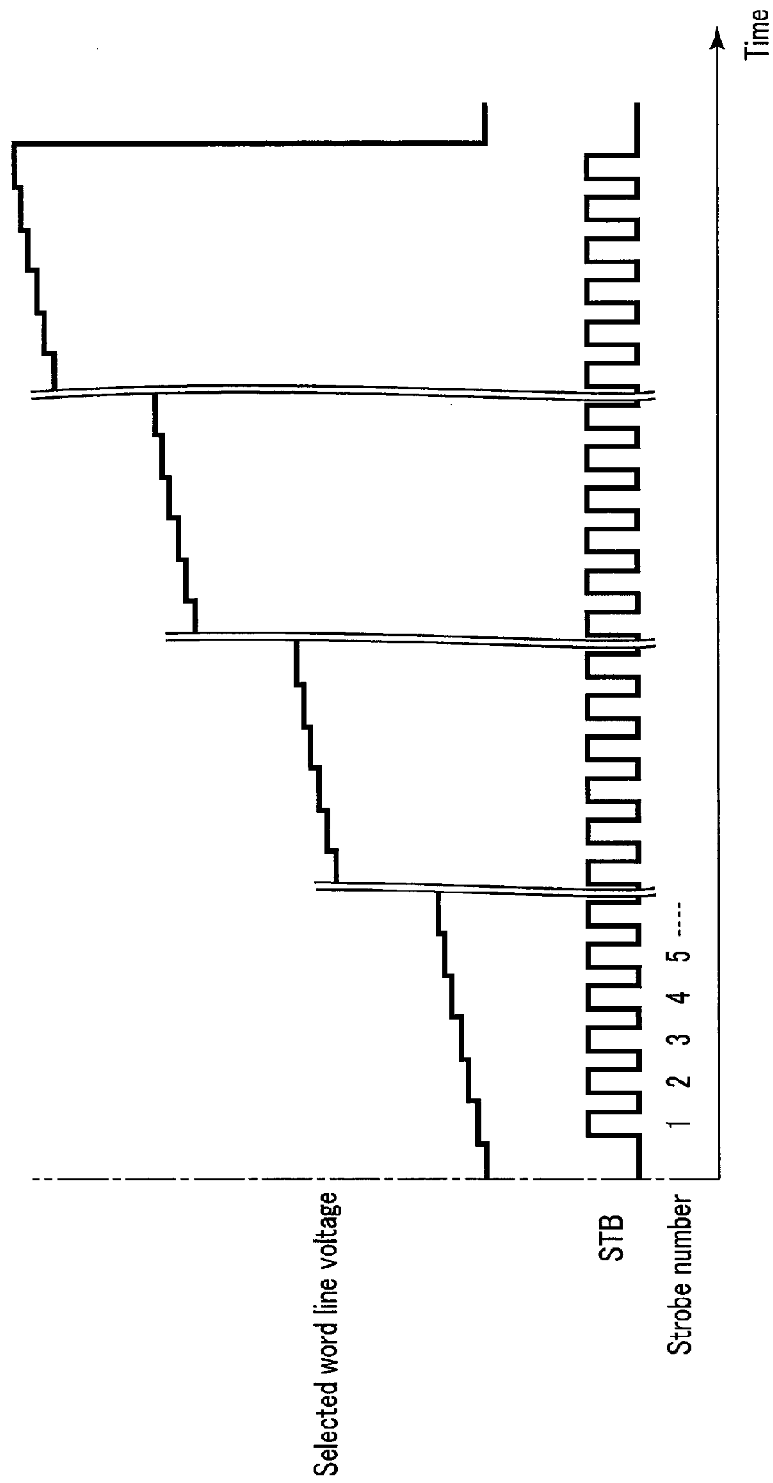
FIG. 34 illustrates an example of a selected word line voltage during a read of a memory device in a modified second embodiment.

The memory device 100 of the modification performs the flow illustrated in FIG. 33 when it receives the relative minimum point information determination instruction. The FIG. 33 flow includes step S51 instead of step S11 of the FIG. 29 flow. In step S51, the sequencer 14 applies a voltage which rises step-wise to the selected word line WL, as illustrated in FIG. 34. Specifically, a first voltage of a magnitude is applied for a particular period and then a second voltage larger than the first one is applied for a particular period, and such applications of voltages are repeated a number of times determined based on the to-be-read page. Periods over which the voltage of a particular magnitude is applied are substantially the same as each other, for example. The sequencer 14 also asserts the signal STB once in each period over which the voltage of the word line WL is maintained. The subsequent operations are the same as those described with reference to FIG. 29.

<2.3. Advantages>

The memory device 100 of the second embodiment can estimate a count of selected cell transistors MT at a relative minimum point of the distribution curve of the threshold voltages of the selected cell transistor MT, i.e., a relative minimum cell count, and a strobe number which specifies the strobe when the selected word line WL is applied with the same voltage as the threshold voltage which the selected cell transistors MT of the relative minimum count has, i.e., a relative minimum strobe number. The memory device 100 can also output the relative minimum cell count and the relative minimum strobe number. The relative minimum cell count and the relative minimum strobe number are determined and output in response to an instruction from the memory controller 200. For this reason, the memory controller 200 does not need to estimate the relative minimum cell count, and the relative minimum strobe number, and it has a process load reduced from the case of estimating by itself.

Third Embodiment

The third embodiment relates to an example of controlling the memory device 100 by the memory controller 200 using the second embodiment.

A memory system 1 of the third embodiment includes the memory device 100 and the memory controller 200, as the memory system 1 of the first embodiment. Moreover, the memory device 100 and the memory controller 200 of the third embodiment include the same functional blocks as those of the memory device 100 and the memory controller 200 of the first embodiment. The memory device 100 and the memory controller 200 are, however, configured to perform operations described in the following. Furthermore, the memory device 100 can determine and output relative minimum cell counts and relative minimum strobe numbers, as in the second embodiment.

<3.1. Operations>

The memory controller 200 monitors the states of data in the memory device 100 and based on the states performs processes for improving accuracy of reads autonomously without instructions of the host device 2 or in response to a predetermined algorithm, for example. Alternatively, the host device 2 may instruct monitoring of the states of data and/or the processes for read accuracy improvement to the memory controller 200. The memory controller 200 performs monitoring of the data states and/or the processes for improving read accuracy, for example during a period without instructions from the host device 2. How much the threshold voltages of cell transistors MT to be monitored and/or to be improved in read accuracy have deteriorated has correlation with the relative minimum cell counts. Based on this, the memory controller 200 uses the relative minimum point information to perform monitoring of the data states and/or the processes for read accuracy improvement. For example, the memory controller 200 compares the relative minimum cell counts with some references. As a result of the comparison, the degree of deterioration of the states of the threshold voltages of the cell transistors to be monitored for data states and/or to be improved in read accuracy can be estimated. Then, the memory controller 200 performs a selected one of plural processes based on the degree of the deterioration.

As an example, the memory controller 200 performs the flow illustrated in FIG. 35 to improve the read accuracy of the data in the memory device 100. FIG. 35 illustrates the flow of processes for read accuracy improvement of data in the memory device 100 by the memory controller 200 of the third embodiment, and illustrates the flow performed to one certain selected cell unit CU in one certain block BLK.

As illustrated in FIG. 35, the memory controller 200 transmits a relative minimum point information determination instruction to the memory device 100 (step S61).

When the memory device 100 receives the instruction, it determines the specified relative minimum point information as described in the second embodiment (step S62). Step S62 includes step S11 or S51, and steps S311 and S312 FIG. 29 or 33, for example.

The memory controller 200 transmits the relative minimum point information output instruction to the memory device 100 (step S63). The threshold voltage of a certain cell transistor MT may vary due to various factors after the write to that cell transistor MT. With that, the memory controller 200 specifies output of, among pairs of the relative minimum strobe number and relative minimum cell count at the respective relative minimum points determined through the instruction in step S61, one pair based on characteristics of a read accuracy improvement process being performed by the memory controller 200. For example, the memory controller 200 specifies relative minimum point information corresponding to a read voltage between a level whose threshold voltages easily change and an adjacent level. Specifically, the memory controller 200 specifies the smallest relative minimum strobe number and the corresponding relative minimum cell count, for example. The selected relative minimum point information is referred to as reference relative minimum point information, which includes a reference relative minimum cell count and a reference relative minimum strobe number.

The memory device 100 outputs the reference relative minimum point information (step S64). The reference relative minimum point information is received by the memory controller 200 (step S65). Note that relative minimum information having been determined means that the levels (threshold voltage distributions) at both sides of the selected word line voltage at the strobe identified by the relative minimum strobe number in the relative minimum pint information (to be referred to as a relative minimum voltage) already overlap as illustrated in FIG. 13(B). For this reason, when based on the FIG. 13 example, use of the default read voltage VB is already unsuitable.

The memory controller 200 determines whether the learned reference relative minimum cell count is smaller than a first reference (step S66). When the reference relative minimum cell count is smaller than the first reference (Yes branch), this is considered to represent that the threshold voltages of the selected cell transistors MT in the selected cell unit CU for which the relative minimum point information was created have deteriorated a little. Based on this, the memory controller 200 performs a first read accuracy improvement process. The first read accuracy improvement process can improve read accuracy a little via a small process. As an example, the memory controller 200 updates setting information therein to use the relative minimum point voltage as a read voltage (step S67). Specifically, it is as follows.

When the memory device 100 is configured to perform a read such as that of the modified second embodiment in response to a fundamental (for example, the first-type) read instruction, the memory device 100 uses default read voltages VCGR (VA, VB, VC, VD, VE, VF, or VG). On the other hand, the memory controller 200 can, for instructing a read, specify addition, to read voltages (for example, VA and VE) used for the read from a read-target page (for example, the lower page), a positive or negative adjustment to their default values. Based on the FIG. 13 example, when a read with the read voltage VB fails at a particular time and a following read with the voltage VB' succeeds, the memory controller 200 can use the read voltage VB' instead of the read voltage VB thereafter. For such control, when the relative minimum voltage differs from the corresponding default read voltage in step S64, the memory controller 200 updates the default read voltage with the relative minimum voltage in the setting information therein. For example, a difference from the default value (i.e., a shift value) is stored. When step S67 is completed, the flow ends and the memory controller 200 uses the updated read voltage thereafter.

When the reference relative minimum cell count is smaller than the first reference in step S66 (No branch), the memory controller 200 determines whether the reference relative minimum cell count is smaller than a second reference (step S68). The second reference is larger than the first reference. When the reference relative minimum cell count is smaller than the second reference (Yes branch), this is considered to represent that the threshold voltages of the selected cell transistors MT in the selected cell unit CU for which the relative minimum point information was created have deteriorated moderately. Based on this, the memory controller 200 performs a second read accuracy improvement process. The second read accuracy improvement process includes more processes than the first read accuracy improvement process, and can improve read accuracy more greatly than the first read accuracy improvement process. As an example, the memory controller 200 performs a partial overwrite to the selected cell unit CU (steps S69 and S70). The details are as follows.

Figure 36:
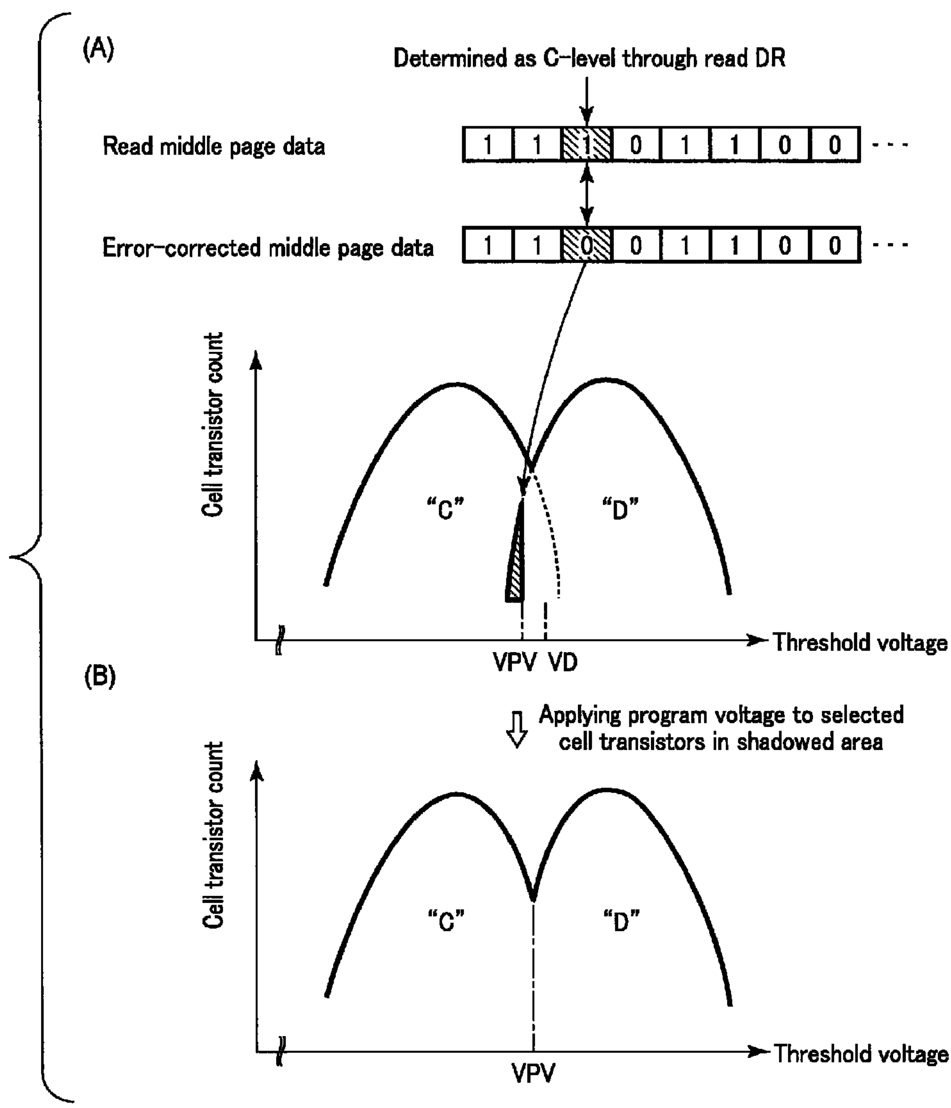
FIG. 36 illustrates an example of a threshold voltage distribution curve before and after an overwrite refresh of a third embodiment.

As illustrated in FIG. 36(A), the memory controller 200 first specifies respective levels to which the selected cell transistors MT in the selected cell unit CU should belong, or expected levels. To this end, the memory controller 200 reads data from all the pages (lower, middle, and upper pages) of the selected cell unit CU. The data read can be performed by any methods including the first and second embodiments. For example, assume that a particular selected cell transistor MT is erroneously determined to belong to the C-level as a result of the determination of whether that selected cell transistor MT has a threshold voltage larger than the read voltage VD, or the read DR. As a result, the read data of the middle page read from the selected cell transistor MT is erroneously determined to store data 1.

The memory controller 200 uses the ECC circuit 250 to correct errors in the memory read data from each page. As a result of the error correction, correct data which should be stored in each page is obtained. From the data for all the obtained pages, the expected level of each selected cell transistor MT is determined. The memory controller 200 compares the correct memory write data determined from the expected levels with the memory read data to determine the selected cell transistor MT which stores erroneous data. The memory controller 200 performs this determination for all the levels except the Er-level.

The memory controller 200 then transmits instructions to perform pre-verifies and overwrite-refreshes to the determined selected cell transistors MT to the memory device 100. When the memory device 100 receives the instructions, it first performs the pre-verifies. A pre-verify includes determination on whether a selected cell transistor MT determined not to be in the expected level (a refresh candidate cell transistor) has a threshold voltage larger than a particular read voltage which is unique for each level. For example, as illustrated in FIG. 36(B), a read voltage VPV lower than the default read voltage VD is applied, and the states of the selected cell transistors MT are determined. As a result, refresh candidate cell transistors MT which turned on (located in the shadowed area) are determined that their expected level is the D-level. In this way, the selected cell transistors MT which belong to the level which is one-level smaller than the expected level are specified.

The memory device 100 then applies the specified selected cell transistors MT which belong to one-level smaller than the expected level with a program voltage once or more to increase their threshold voltages. No program voltage is applied to the selected cell transistors MT determined to belong to the expected level. With such an overwrite, the selected cell transistors MT determined not to belong to the expected level come to have threshold voltages which allows them to be determined to belong to the expected level again.

Referring back to FIG. 35, the memory controller 200 checks the status of the memory device 100 in order to determine the success or failure of processes of the overwrite refresh in step S69 (step S71). The flow then ends.

When the reference relative minimum cell count is equal to or larger than the second reference in step S68 (No branch), the memory controller 200 determines whether the reference relative minimum cell count is smaller than a third reference (step S72). The third reference is larger than the second reference. When the reference relative minimum cell count is smaller than the third reference (Yes branch), this is considered to represent that the threshold voltages of the selected cell transistors MT in the selected cell unit CU for which the relative minimum point information was created have deteriorated greatly. Based on this, the memory controller 200 performs a third read accuracy improvement process. The third read accuracy improvement process includes more processes than the second read accuracy improvement process, and can improve read accuracy to a greater extent than the second read accuracy improvement process. As an example, the memory controller 200 instructs the memory device 100 to copy the data of the whole block BLK which includes the selected cell unit CU to another block BLK (step S73). When the memory device 100 receives the instruction, it performs the instructed copy (step S70).

The memory controller 200 then checks the status of the memory device 100 in order to determine the success or failure of the block copy in step S69 (step S71). The flow then ends.

When the relative minimum cell count is larger than or equal to the third reference in step S72 (No branch), the memory controller 200 instructs other processes for improving data read accuracy to the memory device 100 (step S74). When the memory device 100 receives the instruction, it performs the process based on the instruction (step S75), and the flow ends.

<3.2. Advantages>

For read accuracy of deteriorated data in a memory device to be improved, a memory controller can read data of a whole page for every read accuracy improvement process in the memory device. In this way, when read data is reconstructed into correct data through error correction, updating shift values, overwrite refreshing, and copying data in a block can be performed.

However, the data of the size of a page is large, and, therefore, the page-size data occupies a large part of the band of a bus between the memory device and the memory controller. The target of improvement in data read accuracy is the whole memory area of the memory device at the maximum, and many reads are necessary for improving the read accuracy. This leads to large power consumption of a memory system. Moreover, for a case of the memory controller controlling plural memory devices, one memory device occupies the bus with the memory controller for reads for improving the read data accuracy, which hampers communications between other memory devices and the memory controller.

Furthermore, errors of data read from a memory device may have been corrected only through a full capacity of an ECC circuit or a small capacity thereof. The data error-corrected through a full error correction capacity is liable to include uncorrectable errors as the deterioration progresses, and, therefore, such data is desired to be searchable. In general, however, error correction provides no information on how many errors are included in data when the errors were successfully corrected.

According to the memory system of the third embodiment, the memory controller 200 first obtains only relative minimum point information from the memory device 100 for improving data read accuracy of one selected cell unit CU. When data of a selected cell unit CU has deteriorated significantly, the memory controller 200 cannot avoid reading the data from the selected cell unit CU for improving accuracy in future reads; however, in other cases, it can complete the process for the accuracy improvement without reads from the selected cell unit CU. For this reason, the memory controller 200 and the memory device 100 may only need to communicate a small amount of data for improving the data read accuracy. This can suppress occupancy of the bus between the memory controller 200 and the memory device 100 and the power consumption of the memory system 1.

Moreover, the memory device 100 can output relative minimum cell counts. A relative minimum cell count has a correlation with the deterioration of data stored in cell transistors MT near that relative minimum point in a threshold voltage distribution curve. Specifically, two levels which essentially and/or ideally are separated immediately after a write overlap as the data stored in the cell transistors MT deteriorate. Further, as the deterioration progresses, more cell transistors have threshold voltages which have crossed the boundary between two levels from one level and come to belong to the other level. As a result, a relative minimum cell count increases.

According to the third embodiment, a relative minimum cell count can be transmitted to the memory controller 200 from the memory device 100. This allows the memory controller 200 to use a relative minimum cell count and estimate deterioration of data storing of a selected cell unit CU. The memory controller 200 can perform various processes for improving data read accuracy based on the information on the estimated deterioration. Especially, the memory system 1 can address data which may come to include too many errors to be corrected in the near future, and keep storing data reliably.

Fourth Embodiment

The fourth embodiment relates to operations for improving read accuracy of data in the memory device 100, as in the third embodiment.

The memory system 1 of the fourth embodiment includes the memory device 100 and the memory controller 200, as the memory system 1 of the first embodiment. Furthermore, the memory device 100 and the memory controller 200 of the fourth embodiment include the same functional blocks as those of the memory device 100 and the memory controller 200 of the first embodiment. The memory device 100 and the memory controller 200 are, however, configured to perform operations described in the following.

<4.1. Operations>

The memory controller 200 monitors the states of data in the memory device 100 and based on the states performs processes for improving read accuracy autonomously or in response to instructions from the host device 2, as in the third embodiment.

As an example, the memory controller 200 performs the flow illustrated in FIG. 37 to improve read accuracy of data in the memory device 100. FIG. 37 illustrates the flow of processes for improving read accuracy of data in the memory device 100 by the memory controller 200 of the fourth embodiment, and illustrates the flow performed to a certain selected cell unit CU in one certain block.

As illustrated in FIG. 37, the memory controller 200 instructs the memory device 100 to determine the on-cell counts (step S81). An on-cell count refers to the count of on-cells having each of plural selected word line voltages with different magnitudes for cell transistors (selected cell transistors) MT of a specified selected cell unit CU.

When the memory device 100 receives the instruction, it performs the same processes as those described with reference to FIGS. 10 to 12, and each data latch circuit set DLS stores a strobe number when the corresponding selected cell transistor MT turns on (step S82).

The memory controller 200 instructs the memory device 100 to output on-cell counts (step S83).

When the memory device 100 receives the instruction, it performs the same processes as those described with reference to FIGS. 15 and 16 to determine respective on-cell counts at selected word line voltages with different magnitudes. The memory device 100 then outputs the counts of selected cell transistors MT which turned on by a strobe of each strobe number, i.e., on-cell counts, in ascending order of the strobe numbers, whenever it receives the asserted signal REn (step S84). The memory controller 200 receives the on-cell counts one by one.

Using the received on-cell counts, the memory controller 200 determines a data reading accuracy improvement process, and instructs the determined process to the memory device 100 (step S85). The memory device 100 performs the instructed process (step S86). The memory controller 200 performs a status check (step S71), and the flow ends.

Each step will now be described in detail.

<4.1.1. Step S81 (On-Cell Count Instruction)>

An instruction of on-cell count determination (an on-cell count determination instruction) specifies one selected cell unit CU, and instructs determination of respective on-cell counts at plural selected word line voltages with different magnitudes for the selected cell unit CU.

The memory controller 200 transmits an on-cell count determination instruction OND to the memory device 100, in order to instruct the on-cell count determination. The on-cell count determination instruction OND is generated and transmitted to the memory device 100 from the memory interface 240 by the memory interface 240 and the command generator 241 under instructions of the overall controller 220, and instructs determination of on-cell counts.

FIG. 38 illustrates an example of the signal DQ flowing to the memory device 100 from the memory controller 200 for transmitting the on-cell count determination instruction OND of the fourth embodiment. As illustrated in FIG. 38, the memory controller 200 transmits a command UUh preceding the command 00h. It then transmits address signals for five cycles. The address signals specify a selected cell unit CU, or a selected word line WL in actuality.

The memory controller 200 transmits the command 30h following the address signal RA3. The command 30h instructs, for example, the execution of the operation specified by the set of commands UUh and 00h, i.e., the on-cell count determination.

<4.1.2. Step S82 (Storing Strobe Numbers)>

When the sequencer 14 receives the command 30h, it stores in each data latch circuit DLS the strobe number of the strobe corresponding to the selected word line voltage when the corresponding selected cell transistor MT of the selected cell unit CU turns on. The details are the same as those described with reference to FIGS. 10 to 12. The memory device 100 outputs the busy signal during storing strobe numbers.

Note that when the memory device 100 receives the set of commands 00h to 30h, it performs the same read as the first embodiment, or, in particular, the first-type read.

The memory device 100 may raise the selected word line voltage step-wise and determine strobe numbers when the selected cell transistors MT turn on in response to the on-cell count determination instruction. Specifically, the memory device 100 does not support reads with a continuously rising selected word line voltage as in the modified second embodiment. In addition, the memory device 100 raises the selected word line voltage step-wise and performs a strobe once while the selected word line voltage is substantially flat in response to the on-cell count determination instruction, as described with reference to FIG. 34.

<4.1.3. Step S83 (On-Cell Count Output Instruction) and Step S84>

An instruction of on-cell count output (an on-cell count output instruction) instructs outputting respective on-cell counts at strobe numbers for the selected cell unit CU specified by the preceding on-cell count determination instruction.

The memory controller 200 transmits an on-cell count output instruction OCO to the memory device 100, in order to instruct outputting on-cell counts. The on-cell count output instruction OCO is generated and transmitted to the memory device 100 from the memory interface 240 by the memory interface 240 and the command generator 241 under instructions of the overall controller 220, and instructs the on-cell count output.

FIG. 39 illustrates an example of the signal DQ flowing to the memory device 100 from the memory controller 200 for transmitting the on-cell count output instruction OCO of the fourth embodiment, and an on-cell count output. As illustrated in FIG. 39, the memory controller 200 transmits a command TTh and an address signal A1. The address signal A1 includes a value which specifies the instruction of outputting the on-cell counts determined by the last on-cell count determination instruction before the on-cell count output instruction.

When the memory device 100 receives the address signal A1, it scans values in the data latch circuit sets DLS and counts data latch circuit sets DLS with value 1 therein. It then outputs the result of counting in response to the first assertion of the signal REn. Similarly, the memory device 100 outputs, for each P (P being a natural number of 2 to N), the count of data latch circuit sets DLS which include value P in response to $P^{th}$ assertion of the signal REn. FIG. 39 illustrates the example of P=4.

As a result of step S84, the memory controller 200 knows the on-cell count for each strobe number. The learned on-cell counts are stored in the RAM 230. The learned results are the same as those stored in the memory controller 200 through so-called distribution reads. The distribution reads refer to the memory controller 200 specifying plural reads successively while specifying different read voltages and receiving the counts of selected cell transistors MT which received read voltages and turn on from the memory device 100 one by one, as known by a person skilled in the art.

<4.1.4. Step S84 (Data Read Accuracy Improvement Process Determination and Instruction)>

The memory controller 200 determines a data read accuracy improvement process based on the learned on-cell counts. A specific process can be performed by any methods known by a person skilled in the art. For example, the memory controller 200 performs the same processes as those performed based on the result of distribution reads.

Such processes include, for example, calculating respective selected cell transistors MT with different voltages using plural on-cell counts and performing numerical processes to the calculated relationships between the threshold voltages and the counts of selected cell transistors MT to estimate a fitted threshold voltage distribution curve, as illustrated in FIG. 40 and described with reference to FIG. 22. Moreover, the processes include estimating optimum read voltages from the estimated threshold voltage distribution curve. Furthermore, the processes may include one or more of processes, such as updating shift values for specifying one or more or all of the read voltages, overwrite refreshing, and copying data in an associated block to another block, based on the estimated threshold voltage distribution curve. The memory controller 200 instructs the memory device 100 to perform the determined process or processes.

<4.1.5. Step S86 (Process Based on Instruction)>

Upon reception of the instruction, the memory device 100 performs the process or processes based on the instruction.

<4.1.6. Step S71 (Status Check)>

Upon completion of the process or processes, the memory controller 200 performs step S71 (status check).

<4.2. Advantages>

The memory device 100 of the fourth embodiment outputs respective counts of selected cell transistors which receive different voltages at their gates and turn on in a selected cell unit CU (or, on-cell counts) in response to an instruction from the memory controller 200. This allows the memory controller 200 to obtain data of the same characteristics as that obtained by distribution reads without instructing the memory device 100 to reads with specification of different voltages to be applied to a selected word line, as in distribution reads. Therefore, the memory controller 200 can obtain on-cell counts as with the distribution reads with a small load. This leads to realization of the memory device 100 which is convenient to use for the memory controller 200.

Moreover, the data output from the memory device 100 is mere on-cell counts. With the memory device 100 only outputting information on relative minimum points as in the third embodiment, the memory controller 200 has only a small load for the processes for improving data read accuracy. In general, however, the memory controller 200 has higher computing power than the memory device 100. For this reason, when the memory controller 200 performs, among data read accuracy improvement processes, a process which requires a high computing power, higher data read accuracy may be realizable.

In the fourth embodiment, the memory device 100 only outputs respective on-cell counts for different selected word line voltages. This allows the memory controller 200 to realize high data read accuracy using a process of a load which is generally large for the memory device 100, such as on-cell counts and fitting. Therefore, the memory system 1 which can read data accurately can be provided.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:

a cell transistor coupled to a word line, a sense amplifier configured to output data based on a state of the cell transistor in response to a first signal asserted; and a controller configured to apply a voltage of a magnitude continuously rising to the word line, and periodically assert the first signal after a lapse of any selected one of a first time and a second time from the start of rise of the magnitude of the voltage, the first time being different from the second time.

2. The device according to claim 1, wherein:

the controller is configured to use the first time upon reception of a first instruction and use the second time upon reception of a second instruction.

3. The device according to claim 2, wherein:

the first instruction and the second instruction specify the cell transistor, and the controller is configured to:

output first data to outside the semiconductor memory device upon reception of the first instruction and output second data to outside the semiconductor memory device upon reception of the second instruction.

4. The device according to claim 3, wherein:

the sense amplifier is configured to output data which depends on whether the cell transistors is ON or OFF when the first signal is asserted.

5. The device according to claim 4, wherein:

the controller is configured to store a serial number which indicates a count of assertion of the first signal from the start of the rise of the magnitude of the voltage when the cell transistor turns on for the first time from the start of the rise of the magnitude of the voltage.

6. The device according to claim 2, wherein:

the first instruction specifies one of a first bit and a second bit, and the controller is configured to:

output third data to outside the semiconductor memory device upon reception of the first instruction specifying the first bit, and output fourth data to outside the semiconductor memory device upon reception of the first instruction specifying the second bit.

7. The device according to claim 1, wherein:

the controller is configured to periodically assert the first signal after a lapse of any selected one of the first time, the second time, a third time, and a fourth time from the start of the rise of the magnitude of the voltage, and the first to fourth times differ from each other.

8. The device according to claim 7, wherein:

the controller is configured to:

output fifth data to outside the semiconductor memory device using the third time upon reception of a third instruction and output sixth data to outside the semiconductor memory device using the fourth time upon reception of a fourth instruction, and the third instruction and the fourth instruction specify the cell transistor.

9. A memory system comprising:

the semiconductor memory device according to claim 2, and a memory controller configured to transmit the first instruction to the semiconductor memory device and transmit the second instruction to the semiconductor memory device when errors of data read from the semiconductor memory device in response to the first instruction are uncorrectable.

10. A semiconductor memory device comprising:
cell transistors coupled to a word line;
a sense amplifier configured to output data items which are respectively based on respective states of the cell transistors in response to a first signal asserted; and
a controller configured to apply a voltage of a magnitude which keeps rising to the word line and output a first number indicating a count of first cell transistors which are at a relative minimum and have a first threshold voltage among the cell transistors upon reception of a first instruction.

11. The device according to claim 10, wherein:
the controller is configured to determine the first number upon reception of a second instruction.

12. The device according to claim 11, wherein:
the controller is configured to determine a second number indicating a count of second cell transistors which are at a relative minimum and have a second threshold voltage among the cell transistors upon reception of a second instruction, and
the first number differs from the second number.

13. The device according to claim 12, wherein:
the controller is configured to output one of the first and second numbers specified by the first instruction.

14. The device according to claim 10, wherein:
the controller is configured to:
apply a voltage of a magnitude rising step-wise to the word line and output data which is based on a state of the cell transistor upon reception of a second instruction, and
apply a voltage of a magnitude rising step-wise to the word line upon reception of the first instruction, and
the first instruction includes a first command and the second instruction subsequent to the first command.

15. A memory system comprising:
the semiconductor memory device according to claim 10; and
a memory controller configured to:
transmit the first instruction to the semiconductor memory device, and
perform, among two processes to the cell transistors, one selected based on the first number.

16. A semiconductor memory device comprising:
a word line;
cell transistors coupled to the word line;
a controller configured to periodically assert a first signal while the word line is being applied with a voltage of a magnitude continuously rising in response to reception of a first instruction from external, and
a sense amplifier configured to hold data items which are respectively based on respective states of the cell transistors in data latches in response to the assertions of the first signal; wherein
the controller is configured to output first numbers one by one based on the held data items, and
a first number output $x^{th}$ (x being a natural number) among the first numbers is larger than a first number output $x-1^{th}$.

17. The device according to claim 16, wherein:
each of the first numbers is a count of cell transistors of the cell transistors determined to store first data in response to one assertion of the first signal.

18. The device according to claim 17, wherein:
the cell transistors determined to store the first data are cell transistors which are OFF upon the one assertion of the first signal.

19. The device according to claim 16, wherein:
the controller is configured to determine the first numbers upon reception of a second instruction.

20. A memory system comprising:
the semiconductor memory device according to claim 16; and
a memory controller configured to transmit the first instruction.

* * * * *

UNITED STATES PATENT AND TRADEMARK OFFICE

CERTIFICATE OF CORRECTION

PATENT NO. : 9,953,709 B2
APPLICATION NO. : 15/383165
DATED : April 24, 2018
INVENTOR(S) : Masanobu Shirakawa et al.

It is certified that error appears in the above-identified patent and that said Letters Patent is hereby corrected as shown below:

On the Title Page

Item (73), the Assignee's city is incorrect. Item (73) should read:
--(73) Assignee: TOSHIBA MEMORY CORPORATION, Minato-ku (JP)--

Signed and Sealed this
Fifth Day of March, 2019

Andrei Iancu
*Director of the United States Patent and Trademark Office*